United States Patent
Rehder

(10) Patent No.: US 12,369,409 B2
(45) Date of Patent: Jul. 22, 2025

(54) NANO-METAL CONNECTIONS FOR A SOLAR CELL ARRAY

(71) Applicant: The Boeing Company, Chicago, IL (US)

(72) Inventor: Eric Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 155 days.

(21) Appl. No.: 16/991,589

(22) Filed: Aug. 12, 2020

(65) Prior Publication Data

US 2020/0373446 A1    Nov. 26, 2020

Related U.S. Application Data

(60) Continuation-in-part of application No. 15/643,285, filed on Jul. 6, 2017, and a continuation-in-part of
(Continued)

(51) Int. Cl.
  *H10F 19/00*  (2025.01)
  *H01L 21/02*  (2006.01)
  (Continued)

(52) U.S. Cl.
  CPC ....... *H10F 19/00* (2025.01); *H01L 21/02439* (2013.01); *H02S 40/30* (2014.12);
  (Continued)

(58) Field of Classification Search
  None
  See application file for complete search history.

(56) References Cited

U.S. PATENT DOCUMENTS

| 3,376,164 A | 4/1968 | Bachwansky |
| 3,833,426 A | 9/1974 | Mesch |

(Continued)

FOREIGN PATENT DOCUMENTS

| CN | 104241406 | * 6/2013 |
| CN | 203277428 U | 11/2013 |

(Continued)

OTHER PUBLICATIONS

Final Office Action dated Feb. 11, 2022 for U.S. Appl. No. 16/847,032.
(Continued)

*Primary Examiner* — Dustin Q Dam
(74) *Attorney, Agent, or Firm* — MH2 Technology Law Group LLP

(57) ABSTRACT

An electrical connection is formed between first and second conductive elements, by inserting a nano-metal material between the first and second conductive elements; and heating the nano-metal material to a melting temperature to form the electrical connection between the first and second conductive elements. The nano-metal material may comprise a nano-metal paste or ink comprised of one or more of Gold (Au), Copper (Cu), Silver (Ag), and/or Aluminum (Al) nano-particles that melt or fuse into a solid to form the electrical connection, at a melting temperature of about 150-250 degrees C., and more preferably, about 175-225 degrees C. The electrical connection may be formed between a solar cell and a substrate by creating a via in the solar cell between a front and back side of the solar cell, wherein the via is connected to a contact on the front side of the solar cell and a trace on the substrate.

20 Claims, 21 Drawing Sheets

Related U.S. Application Data application No. 15/643,282, filed on Jul. 6, 2017, and a continuation-in-part of application No. 15/643,289, filed on Jul. 6, 2017, now Pat. No. 11,437,533, and a continuation-in-part of application No. 15/643,279, filed on Jul. 6, 2017, and a continuation-in-part of application No. 15/643,274, filed on Jul. 6, 2017, and a continuation-in-part of application No. 15/643,277, filed on Jul. 6, 2017, and a division of application No. 15/643,287, filed on Jul. 6, 2017, now Pat. No. 10,763,383.

(60) Provisional application No. 62/394,616, filed on Sep. 14, 2016, provisional application No. 62/394,632, filed on Sep. 14, 2016, provisional application No. 62/394,629, filed on Sep. 14, 2016, provisional application No. 62/394,666, filed on Sep. 14, 2016, provisional application No. 62/394,672, filed on Sep. 14, 2016, provisional application No. 62/394,623, filed on Sep. 14, 2016, provisional application No. 62/394,636, filed on Sep. 14, 2016, provisional application No. 62/394,667, filed on Sep. 14, 2016, provisional application No. 62/394,641, filed on Sep. 14, 2016, provisional application No. 62/394,649, filed on Sep. 14, 2016, provisional application No. 62/394,627, filed on Sep. 14, 2016, provisional application No. 62/394,671, filed on Sep. 14, 2016.

(51) Int. Cl.
| | |
|---|---|
| *H02S 40/30* | (2014.01) |
| *H02S 40/34* | (2014.01) |
| *H10F 10/142* | (2025.01) |
| *H10F 19/50* | (2025.01) |
| *H10F 19/70* | (2025.01) |
| *H10F 19/75* | (2025.01) |
| *H10F 19/80* | (2025.01) |
| *H10F 19/90* | (2025.01) |
| *H10F 77/00* | (2025.01) |
| *H10F 77/14* | (2025.01) |
| *H10F 77/169* | (2025.01) |
| *H10F 77/20* | (2025.01) |
| *H10F 10/00* | (2025.01) |

(52) U.S. Cl.
CPC ........... *H02S 40/34* (2014.12); *H10F 10/142* (2025.01); *H10F 19/50* (2025.01); *H10F 19/70* (2025.01); *H10F 19/75* (2025.01); *H10F 19/80* (2025.01); *H10F 19/90* (2025.01); *H10F 19/902* (2025.01); *H10F 19/904* (2025.01); *H10F 19/908* (2025.01); *H10F 77/00* (2025.01); *H10F 77/1437* (2025.01); *H10F 77/147* (2025.01); *H10F 77/148* (2025.01); *H10F 77/169* (2025.01); *H10F 77/211* (2025.01); *H10F 77/935* (2025.01); *H10F 77/955* (2025.01); *H10F 10/00* (2025.01); *Y02E 10/544* (2013.01)

(56) References Cited

U.S. PATENT DOCUMENTS

| | | | |
|---|---|---|---|
| 4,057,439 | A | 11/1977 | Lindmayer |
| 4,257,821 | A | 3/1981 | Kelly et al. |
| 4,481,378 | A | 11/1984 | Lesk |
| 4,755,231 | A | 7/1988 | Kurland et al. |
| 5,330,583 | A | 7/1994 | Asai et al. |
| 5,391,235 | A | 2/1995 | Inoue |
| 5,567,248 | A | 10/1996 | Chung |
| 5,701,067 | A | 12/1997 | Kaji et al. |
| 5,855,692 | A | 1/1999 | Kaji et al. |
| 6,008,448 | A | 12/1999 | Peck |
| 6,034,322 | A | 3/2000 | Pollard |
| 6,156,967 | A | 12/2000 | Ralph et al. |
| 6,313,396 | B1 | 11/2001 | Gregory |
| 6,350,944 | B1 | 2/2002 | Sherif et al. |
| 6,441,297 | B1 | 8/2002 | Keller et al. |
| 6,543,725 | B1 | 4/2003 | Meurer et al. |
| 6,555,739 | B2 | 4/2003 | Kawam |
| 6,563,289 | B1 | 5/2003 | Cross |
| 6,637,702 | B1 | 10/2003 | McCandless |
| 8,604,330 | B1 | 12/2013 | Hennessy et al. |
| 8,814,099 | B1 | 8/2014 | Harvey et al. |
| 9,120,583 | B1 | 9/2015 | Spence et al. |
| 9,758,261 | B1 | 9/2017 | Steinfeldt |
| 2003/0057533 | A1 | 3/2003 | Lemmi et al. |
| 2004/0118446 | A1 | 6/2004 | Toyomura |
| 2005/0133079 | A1 | 6/2005 | Boulanger et al. |
| 2006/0170435 | A1 | 8/2006 | Granicher et al. |
| 2007/0005843 | A1 | 1/2007 | Sim et al. |
| 2007/0152194 | A1* | 7/2007 | Natekar ............... H05K 1/097 427/256 |
| 2008/0142071 | A1 | 6/2008 | Dorn et al. |
| 2008/0245405 | A1 | 10/2008 | Garvison et al. |
| 2008/0295889 | A1 | 12/2008 | Schindler et al. |
| 2009/0183760 | A1 | 7/2009 | Meyer |
| 2009/0255571 | A1 | 10/2009 | Xia et al. |
| 2009/0272436 | A1 | 11/2009 | Cheung |
| 2010/0012172 | A1 | 1/2010 | Meakin et al. |
| 2010/0089435 | A1 | 4/2010 | Lockenhoff |
| 2010/0126560 | A1 | 5/2010 | Lauvray et al. |
| 2010/0186795 | A1 | 7/2010 | Gaul |
| 2010/0212741 | A1* | 8/2010 | Lin ...................... H01L 31/0543 136/259 |
| 2010/0295383 | A1 | 11/2010 | Cummings |
| 2010/0313954 | A1 | 12/2010 | Seel |
| 2011/0005582 | A1* | 1/2011 | Szlufcik ............ H01L 31/02245 257/E31.113 |
| 2011/0041890 | A1* | 2/2011 | Sheats .............. H01L 31/022433 136/244 |
| 2011/0073163 | A1 | 3/2011 | Cheung |
| 2011/0079263 | A1 | 4/2011 | Avrutsky |
| 2011/0120752 | A1 | 5/2011 | Imai et al. |
| 2011/0138609 | A1 | 6/2011 | Chereukupalli |
| 2011/0168238 | A1 | 7/2011 | Metin et al. |
| 2011/0198444 | A1 | 8/2011 | Dong |
| 2012/0103388 | A1 | 5/2012 | Meakin et al. |
| 2012/0125391 | A1 | 5/2012 | Pinarbasi et al. |
| 2012/0161801 | A1 | 6/2012 | Hasegawa |
| 2012/0167954 | A1 | 7/2012 | Meakin et al. |
| 2012/0199176 | A1 | 8/2012 | Hong et al. |
| 2012/0313455 | A1 | 12/2012 | Atham |
| 2013/0014802 | A1 | 1/2013 | Zimmerman |
| 2013/0056047 | A1 | 3/2013 | Beck et al. |
| 2013/0263915 | A1 | 10/2013 | Snidow |
| 2014/0000682 | A1* | 1/2014 | Zhao .................... H01L 31/0481 136/251 |
| 2014/0033625 | A1 | 2/2014 | Jenkins et al. |
| 2014/0083497 | A1* | 3/2014 | Ehrenpfordt .......... H01L 31/049 438/19 |
| 2014/0166067 | A1 | 6/2014 | McGlynn et al. |
| 2014/0255780 | A1 | 9/2014 | Mikhaylik et al. |
| 2014/0366927 | A1 | 12/2014 | Lavrova et al. |
| 2015/0083191 | A1 | 3/2015 | Gmundner |
| 2015/0096607 | A1 | 4/2015 | Yong |
| 2015/0144173 | A1 | 5/2015 | Hoang et al. |
| 2015/0287862 | A1 | 10/2015 | Pardell Vilella |
| 2015/0318420 | A1 | 11/2015 | Sewell et al. |
| 2015/0349703 | A1 | 12/2015 | Morad et al. |
| 2016/0112004 | A1 | 4/2016 | Thiel et al. |
| 2016/0126380 | A1 | 5/2016 | Chang |
| 2016/0197207 | A1 | 7/2016 | Morioka et al. |
| 2016/0218665 | A1 | 7/2016 | Crist |
| 2016/0380221 | A1 | 12/2016 | Gotanda et al. |
| 2017/0040933 | A1 | 2/2017 | Vogel |
| 2017/0054406 | A1 | 2/2017 | Narla et al. |
| 2017/0098736 | A1 | 4/2017 | Lee et al. |
| 2017/0163212 | A1 | 6/2017 | France et al. |

(56) References Cited

U.S. PATENT DOCUMENTS

| | | | |
|---|---|---|---|
| 2017/0229692 | A1 | 8/2017 | Thiel et al. |
| 2017/0374737 | A1 | 12/2017 | Jeong et al. |
| 2019/0127089 | A1 | 5/2019 | Tomoda et al. |
| 2019/0140584 | A1 | 5/2019 | Hayashi et al. |

FOREIGN PATENT DOCUMENTS

| | | | |
|---|---|---|---|
| CN | 103155158 | * | 12/2014 |
| CN | 104443439 | | 3/2015 |
| CN | 104443439 | A | 3/2015 |
| DE | 10136442 | | 2/2003 |
| DE | 10136442 | A1 | 2/2003 |
| EP | 1548 847 | | 6/2005 |
| EP | 2833416 | | 2/2015 |
| EP | 2981156 | | 2/2016 |
| JP | 2002190612 | | 7/2002 |
| JP | 2002190612 | A | 7/2002 |
| JP | 2005-200006 | | 7/2005 |
| JP | 2011071214 | | 4/2011 |
| JP | 2011210747 | A | 10/2011 |
| JP | 2013175624 | A | 9/2013 |
| WO | 2009/012567 | | 1/2009 |

OTHER PUBLICATIONS

Non-Final Office Action dated Dec. 7, 2020 for U.S. Appl. No. 15/787,304.
Final Office Action dated Apr. 22, 2021 for U.S. Appl. No. 15/643,285.
Non-Final Office Action dated Mar. 14, 2022 for U.S. Appl. No. 15/643,282.
Non-Final Office Action dated Jan. 7, 2021 for U.S. Appl. No. 15/787,291.
Final Office Action dated Aug. 22, 2019 for U.S. Appl. No. 15/643,274.
Final Office Action dated Apr. 10, 2020 for U.S. Appl. No. 15/643,282.
Extended European Search Report dated Dec. 8, 2017for EP application No. 17191159.7.
Final Office Action dated May 19, 2020 for U.S. Appl. No. 15/787,304.
Final Office Action dated Aug. 13, 2021 for U.S. Appl. No. 15/938,791.
European Communication dated Feb. 19, 2020 for EP Application No. 18176224.6.
Non-Final Office Action dated Sep. 17, 2021 for U.S. Appl. No. 15/643,277.
Non-Final Office Action dated Aug. 2, 2021 for U.S. Appl. No. 15/643,282.
Non-Final Office Action dated Feb. 21, 2019 for U.S. Appl. No. 15/643,285.
Non-Final Office Action dated Dec. 9, 2019 for U.S. Appl. No. 15/643,282.
Non-Final Office Action dated Mar. 31, 2020 for U.S. Appl. No. 15/643,274.
Non-Final Office Action dated Jan. 3, 2020 for U.S. Appl. No. 15/938,787.
Extended European Search Report dated Dec. 19, 2017 for EP application No. 17191168.8.
Final Office Action dated Jun. 6, 2019 for U.S. Appl. No. 15/643,282.
Non-Final Office Action dated Dec. 6, 2021 for U.S. Appl. No. 15/643,279.
Final Office Action dated Mar. 12, 2021 for U.S. Appl. No. 15/643,282.
Extended European Search Report dated Nov. 12, 2018 for EP Application No. 18176222.0.
Non-Final Office Action dated Mar. 14, 2019 for U.S. Appl. No. 15/787,291.
Non-Final Office Action dated Feb. 8, 2019 for Utility U.S. Appl. No. 15/643,274.
Final Office Action dated Feb. 24, 2022 for U.S. Appl. No. 15/643,277.
Final Office Action dated Jun. 1, 2021 for U.S. Appl. No. 15/643,277.
Final Office Action dated Jul. 10, 2020 for U.S. Appl. No. 15/938,787.
Final Office Action dated Jan. 15, 2019 for Utility U.S. Appl. No. 15/643,277.
Non-Final Office Action dated Dec. 22, 2020 for U.S. Appl. No. 15/643,285.
Final Office Action dated Mar. 5, 2021 for U.S. Appl. No. 15/643,279.
Japanese Notification of Reasons for Refusal dated Oct. 5, 2021 for JP Application No. 2017-176670.
Non-Final Office Action dated Feb. 1, 2021 for U.S. Appl. No. 15/643,277.
Non-Final Office Action dated Jul. 23, 2019 for U.S. Appl. No. 15/643,279.
Final Office Action dated Dec. 9, 2021 for U.S. Appl. No. 15/938,787.
1 Final Office Action dated Sep. 2, 2020 for U.S. Appl. No. 15/643,274.
Non-Final Office Action dated Mar. 19, 2020 for U.S. Appl. No. 15/643,289.
Non-Final Office Action dated Mar. 24, 2020 for U.S. Appl. No. 15/643,277.
Final Office Action dated Jun. 8, 2020 for U.S. Appl. No. 15/643,285.
Non-Final Office Action dated Nov. 9, 2020 for U.S. Appl. No. 15/643,282.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Non-Final Office Action dated May 12, 2021 for U.S. Appl. No. 15/643,274.
Final Office Action dated Oct. 1, 2020 for U.S. Appl. No. 15/643,289.
Final Office Action dated Jul. 9, 2019 for U.S. Appl. No. 15/787,304.
Non-Final Office Action dated Nov. 22, 2019 for U.S. Appl. No. 15/938,791.
Non-Final Office Action dated Jan. 8, 2020 for U.S. Appl. No. 15/787,304.
European Examination Communication dated Dec. 1, 2020 for EP Application No. 17191162.1.
European Search Report dated Dec. 21, 2017 for EP application No. 17191166.2.
Baumli et al., "Solder Materials With Micro and Nanoparticles: a Review", Materials Science and Engineering,Jan. 1, 2015, pp. 42-49.
Non-Final Office Action dated Feb. 18, 2021 for U.S. Appl. No. 15/938,791.
Japanese Notice of Reasons for Rejection (with English translation) dated May 31, 2022 for Japanese Patent Application No. 2017-176672.
Final Office Action dated Dec. 15, 2021 for U.S. Appl. No. 15/787,304.
Non-Final Office Action dated Apr. 27, 2021 for U.S. Appl. No. 15/938,787.
Final Office Action dated Feb. 14, 2022 for U.S. Appl. No. 16/847,359.
Final Office Action dated Jan. 20, 2022 for U.S. Appl. No. 15/643,285.
Extended European Search Report dated Dec. 7, 2017 for EP application No. 17191154.8.
Non-Final Office Action dated Feb. 5, 2019 for Utility U.S. Appl. No. 15/643,282.
European Search Report dated Dec. 19, 2017 for EP application No. 17191162.1.
Final Office Action dated Dec. 28, 2021 for U.S. Appl. No. 15/643,282.
Final Office Action dated Jul. 12, 2019 for U.S. Appl. No. 15/643,285.
Stern, T., et al., "Modular Solar Panels Using Components Engineered for Producibility", Photovoltaic Specialists Conference (PVSC), 2011 37th IEEE, Jun. 19, 2024, 2011, pp. 001626-001629.
Walmsley, N., et al., "Increasing the TRL Level of New PV Technologies Using Modular Solar Panels", Photovoltaic Specialists Conference (PVSC), 2012 38th IEEE, Jun. 3-8, 2012, pp. 002835-002839.
European Search Report dated Dec. 4, 2017 for EP application No. 17191134.
Final Office Action dated Jun. 3, 2022 for U.S. Appl. No. 15/643,279.
Final Office Action dated Jul. 17, 2019 for U.S. Appl. No. 15/6787,291.

(56) References Cited

OTHER PUBLICATIONS

Final Office Action dated Jul. 28, 2020 for U.S. Appl. No. 15/643,277.
Non-Final Office Action dated Feb. 4, 2020 for U.S. Appl. No. 15/787,291.
European Examination Report dated Dec. 2, 2020 for European Patent Application No. 17191166.2.
Final Office Action dated Aug. 6, 2019 for U.S. Appl. No. 15/643,289.
Final Office Action dated Oct. 10, 2019 for U.S. Appl. No. 15/643,277.
Non-Final Office Action dated Jan. 17, 2020 for U.S. Appl. No. 15/643,285.
Non-Final Office Action dated Sep. 29, 2021 for U.S. Appl. No. 15/643,289.
Final Office Action dated Dec. 17, 2021 for U.S. Appl. No. 15/787,291.
Final Office Action dated Apr. 15, 2020 for U.S. Appl. No. 15/938,791.
Final Office Action dated Jun. 15, 2020 for U.S. Appl. No. 15/787,291.
Non-Final Office Action dated Mar. 14, 2019 for U.S. Appl. No. 15/787,304.
Notice of Allowance dated Apr. 20, 2022 for U.S. Appl. No. 15/643,289.
Final Office Action dated Feb. 6, 2020 for U.S. Appl. No. 15/643,279.
Final Office Action dated Apr. 10, 2019 for U.S. Appl. No. 15/643,279.
Final Office Action dated Dec. 1, 2022 for U.S. Appl. No. 15/643,277.
Non-Final Office Action dated Nov. 14, 2022 for U.S. Appl. No. 15/643,285.
Non-Final Office Action dated Dec. 20, 2022 for U.S. Appl. No. 15/643,282.
Non-Final Office Action dated Dec. 23, 2022 for U.S. Appl. No. 17/878,348.
Non-Final Office Action dated Dec. 22, 2022 for U.S. Appl. No. 15/938,787.
Non-Final Office Action dated Apr. 19, 2023 for U.S. Appl. No. 15/787,304.
Final Office Action dated Mar. 31, 2023 for U.S. Appl. No. 15/643,279.
Non-Final Office Action dated May 11, 2023 for U.S. Appl. No. 15/643,277.
Non-Final Office Action dated May 5, 2023 for U.S. Appl. No. 15/797,291.
Final Office Action dated Feb. 6, 2023 for U.S. Appl. No. 17/100,823.
Non-Final Office Action dated Oct. 25, 2023 for U.S. Appl. No. 15/643,274.
Non-Final Office Action dated Oct. 26, 2023 for U.S. Appl. No. 17/878,348.
Final office Action dated Jul. 7, 2023 for U.S. Appl. No. 17/878,348.
Non-Final Office Action dated Aug. 4, 2023 for U.S. Appl. No. 17/100,823.
Final Office Action dated Oct. 10, 2023 for U.S. Appl. No. 15/938,791.
Japanese Notice for Reasons of Refusal dated Aug. 3, 2023 for Japanese Application No. 2022-15539.
Final Office Action dated Jun. 15, 2023 for U.S. Appl. No. 15/643,285.
Final Office Action dated Jun. 27, 2023 for U.S. Appl. No. 15/643,282.
Final Office Action dated Nov. 15, 2023 for U.S. Appl. No. 15/643,277.
Final Office Action dated Jun. 22, 2023 for U.S. Appl. No. 15/938,787.
Non-Final Office Action dated Sep. 13, 2023 for U.S. Appl. No. 15/643,279.
Non-Final Office Action dated Nov. 9, 2023 for U.S. Appl. No. 15/643,282.
Final Office Action dated Sep. 11, 2023 for U.S. Appl. No. 15/787,291.
Non-Final Office Action dated Sep. 25, 2023 for U.S. Appl. No. 16/847,032.
Final Office Action dated May 23, 2024 for U.S. Appl. No. 15/643,282.
Final Office Action dated May 24, 2024 for U.S. Appl. No. 15/787,291.
Final Office Action dated Apr. 24, 2024 for U.S. Appl. No. 15/643,274.
Final Office Action dated May 10, 2024 for U.S. Appl. No. 15/787,304.
Non-Final Office Action dated May 14, 2024 for U.S. Appl. No. 15/643,277.
Non-Final Office Action dated Jan. 26, 2024 for U.S. Appl. No. 15/787,304.
Notice of Allowance dated Jan. 24, 2024 for U.S. Appl. No. 16/847,032.
Final Office Action dated Mar. 4, 2024 for U.S. Appl. No. 15/643,279.
Non-Final Office Action dated Dec. 27, 2023 for U.S. Appl. No. 15/787,291.
Non-Final Office Action dated Feb. 8, 2024 for U.S. Appl. No. 15/938,791.
Final Office Action dated Jan. 9, 2024 for U.S. Appl. No. 17/100,823.
Non-Final Office Action dated May 7, 2024 for U.S. Appl. No. 17/100,823.
Non-Final Office Action dated Jun. 18, 2024 for U.S. Appl. No. 15/643,279.
Final Office Action dated Aug. 25, 2022 for U.S. Appl. No. 15/643,282.
Notice of Allowance dated Jun. 23, 2022 for U.S. Appl. No. 16/847,359.
Non-Final Office Action dated Jul. 1, 2022 for U.S. Appl. No. 15/643,277.
Non-Final Office Action dated Sep. 15, 2022 for U.S. Appl. No. 16/543,279.
Non-Final Office Action dated Sep. 21, 2022 for U.S. Appl. No. 17/100,823.
Extended European Search Report dated Jul. 8, 2019 for European Patent Application No. 19162438.6.

\* cited by examiner

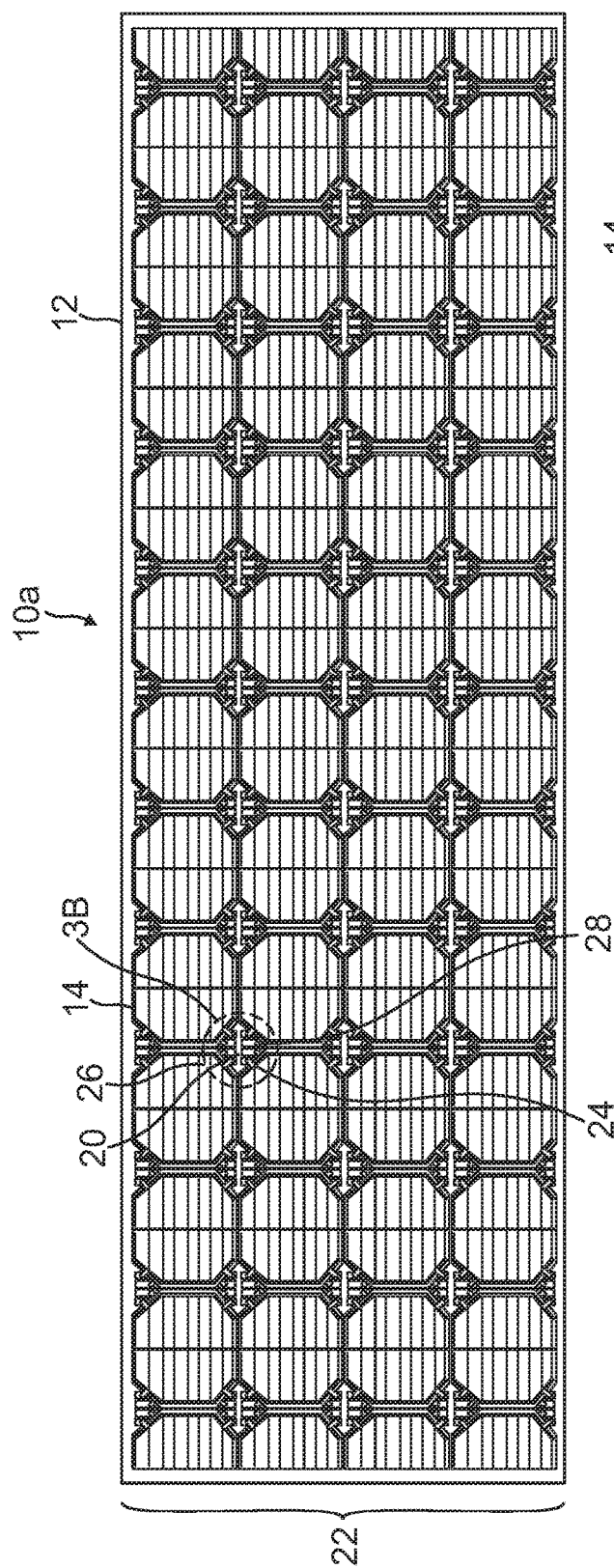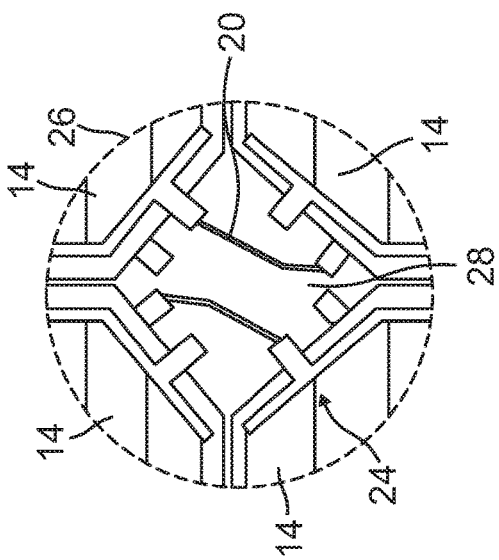
FIG. 3A
FIG. 3B

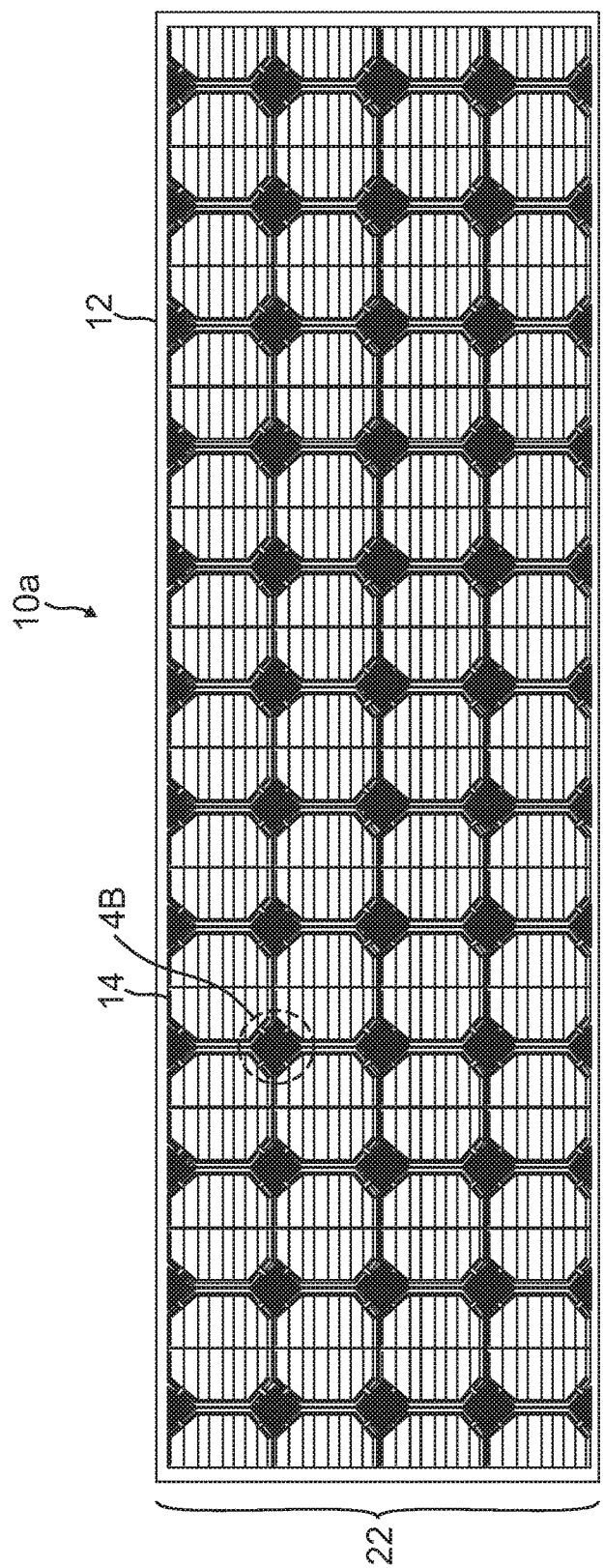
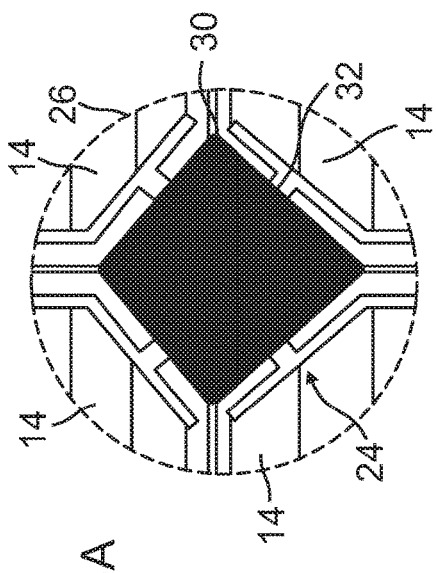
FIG. 4A
FIG. 4B

NANO-METAL CONNECTIONS FOR A SOLAR CELL ARRAY

CROSS REFERENCE TO RELATED APPLICATIONS

This application is a divisional under 35 U.S.C. Section 121 of the following and commonly-assigned application:

U.S. Utility application Ser. No. 15/643,287, filed on Jul. 6, 2017, by Eric Rehder, entitled "NANO-METAL CONNECTIONS FOR A SOLAR CELL ARRAY," now U.S. Pat. No. 10,763,383, issued Sep. 1, 2020;

which application claims the benefit under 35 U.S.C. Section 119(e) of the following and commonly-assigned applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR ARRAY,";

U.S. Provisional Application Ser. No. 62/394,629, filed on Sep. 14, 2016, by Eric Rehder, entitled "MULTI-LAYER CONDUCTORS IN A SOLAR ARRAY,";

U.S. Provisional Application Ser. No. 62/394,632, filed on Sep. 14, 2016, by Eric Rehder, entitled "REWORK AND REPAIR OF COMPONENTS IN A SOLAR ARRAY,";

U.S. Provisional Application Ser. No. 62/394,649, filed on Sep. 14, 2016, by Eric Rehder, entitled "POWER ROUTING MODULE FOR A SOLAR ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, Philip Chiu, Tom Crocker and Daniel Law, entitled "PRINTED CONDUCTORS IN A SOLAR CELL ARRAY,"; and U.S. Provisional Application Ser. No. 62/394,672, filed on Sep. 14, 2016, by Eric Rehder, entitled "SOLAR CELLS FOR A SOLAR CELL ARRAY,";

all of which applications are incorporated by reference herein; and which application claims the benefit under 35 U.S.C. Section 120 of the following and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,";

U.S. Utility application Ser. No. 15/643,279, filed on Jul. 6, 2017, by Eric Rehder, entitled "REWORK AND REPAIR OF COMPONENTS IN A SOLAR ARRAY,";

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the and commonly-assigned provisional applications listed above: 62/394,636; 62/394,616; 62/394,623; 62/394,627; 62/394,629; 62/394,632; 62/394,649; 62/394,666; 62/394,667; 62/394,671; 62/394,641; and 62/394,672; and all of which applications are incorporated by reference herein.

BACKGROUND INFORMATION

1. Field

The disclosure is related generally to solar cell panels and, more specifically, to nano-metal connections for a solar cell array, which may be used with contacts for the solar cell array.

2. Background

Typical spaceflight-capable solar cell panel assembly involves building long strings of solar cells. These strings are variable in length and can be very long, for example, up to and greater than 20 cells. Assembling such long, variable, and fragile materials is difficult, which has prevented automation of the assembly.

Existing solutions use solar cells assembled into CIC (cell, interconnect and coverglass) units. The CIC has metal foil interconnects connected to the front of the cell that extend in parallel from one side of the CIC. The CICs are located close to each other and the interconnects make connection to the bottom of an adjacent cell. Using these interconnects, the CICs are assembled into linear strings. These linear strings are built-up manually and then laid out to form a large solar cell array comprised of many strings of variable length.

Additionally, a bypass diode is used to protect the cells from reverse bias, when the cells become partially shadowed. The bypass diode generally connects the back contacts of two adjacent cells within the solar cell array.

When used in a satellite, the solar cell array is typically packaged as a panel. The dimensions of the panel are dictated by the needs of the satellite, including such constraints as needed power, as well as the size and shape necessary to pack and store the satellite in a launch vehicle. Furthermore, the deployment of the panel often requires that some portions of the panel are used for the mechanical fixtures and the solar cell array must avoid these locations.

In practice, the panel is generally rectangular, but its dimensions and aspect ratio vary greatly. The layout of the CICs and strings to fill this space must be highly customized for maximum power generation, which results in a fabrication process that is highly manual.

What is needed, then, is a means for promoting automated manufacturing of solar arrays, while preserving the ability for customization of solar cell arrays.

SUMMARY

The devices and methods of the present disclosure are embodied in many ways, including, but not limited to, the following examples listed below.

1. An electrical connection formed between first and second conductive elements, comprising: inserting a nano-metal material between the first and second conductive elements; and heating the nano-metal to form the electrical connection between the first and second conductive elements.
2. The electrical connection is between a solar cell and a substrate on which the solar cell is attached, and the first and second conductive elements comprise (1) a metal foil interconnect and a plated surface layer on the substrate, and/or (2) a metal foil interconnect and a front or back contact on the solar cell.
3. The nano-metal material comprises a nano-metal paste comprised of one or more of Gold (Au), Copper (Cu), Silver (Ag), and/or Aluminum (Al) nano-particles that melt or fuse into a solid to form the electrical connection. The nano-particles have sizes less than about 100 nm, and more preferably, in a range of about 0.5-10 nm. The nano-metal material has a fusing temperature of about 150-250 degrees C., and more preferably, about 175-225 degrees C.
4. An electrical connection formed between a solar cell and a substrate by: creating a through-hole in the solar cell between a front side and a back side of the solar cell; passivating inside the through-hole in the solar cell between the front side and the back side of the solar cell; depositing an insulating layer inside the through-hole and wrapping on portions of front or back surfaces of the solar cell adjacent the through-hole; depositing a conductive layer inside the through-hole and on portions of both front and back surfaces of the solar cell adjacent the through-hole to create a via from the front side to the back side of the solar cell, thereby creating a back contact for the solar cell, wherein the via is also connected to a contact on the front side of the solar cell; and then connecting the back contact to a trace on the substrate to form the electrical connection.
5. The via may be connected to the trace on the substrate by laser welding through the substrate, soldering, or applying a nano-metal paste.

DRAWINGS

Referring now to the drawings in which like reference numbers represent corresponding parts throughout:

FIGS. 3A and 3B illustrate an improved structure for a solar cell panel, according to one example.

FIGS. 4A and 4B illustrate an alternative structure for the solar cell panel, according to one example.

Figure 18:
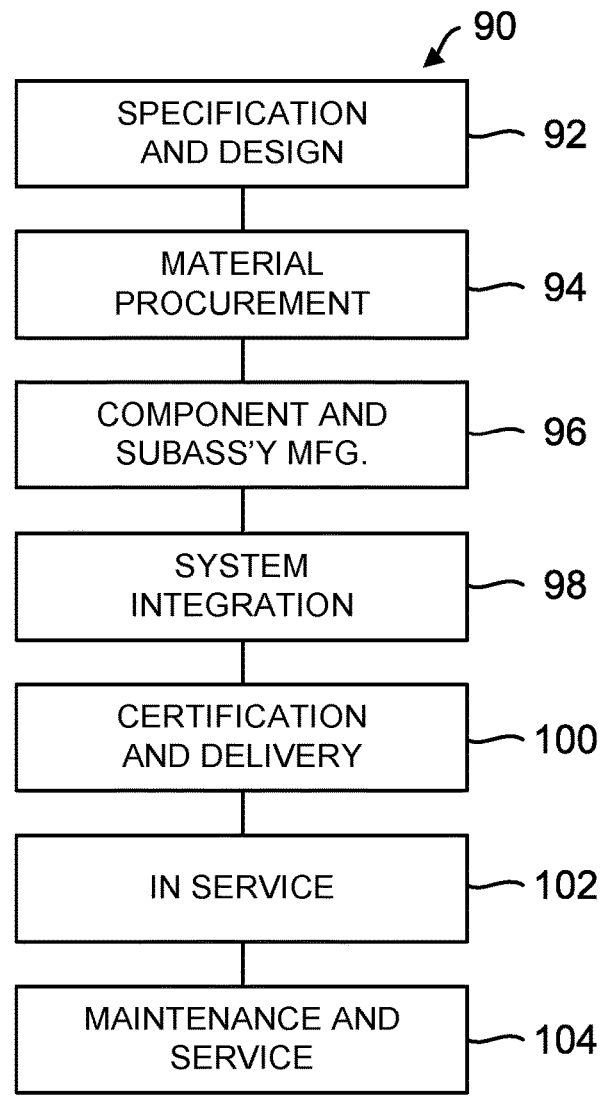

FIG. 18 describes a method of fabricating a solar cell, solar cell panel and/or satellite, according to one example.

Figure 19:
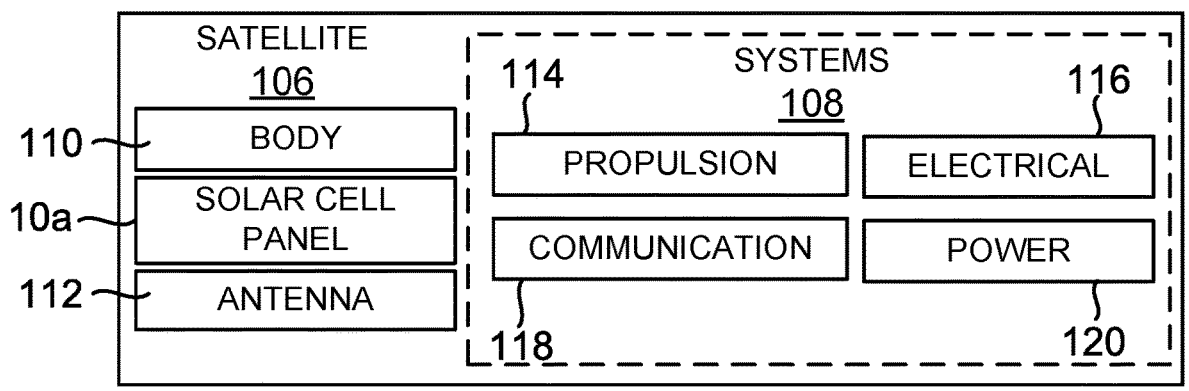

FIG. 19 illustrates a resulting satellite having a solar cell panel comprised of solar cells, according to one example.

Figure 20:
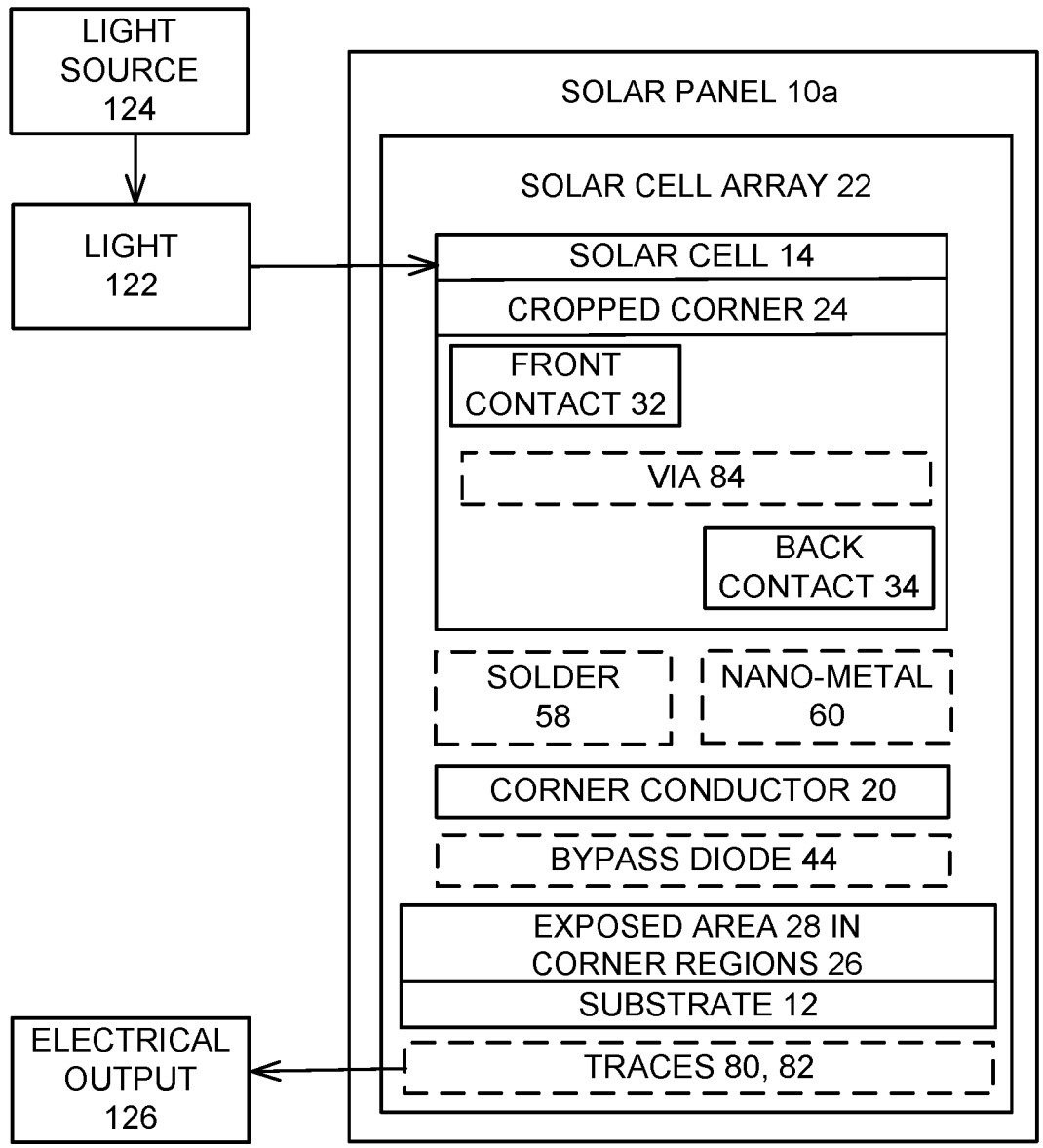

FIG. 20 is an illustration of the solar cell panel in the form of a functional block diagram, according to one example.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

General Description

A new approach to the design of solar cell arrays, such as those used for spaceflight power applications, is based on electrical connections among the solar cells in the array.

This new approach rearranges the components of a solar cell and the arrangements of the solar cells in the array. Instead of having solar cells connected into long linear strings and then assembled onto a substrate, the solar cells are attached individually to a substrate, such that corner regions of adjacent cells are aligned on the substrate, thereby exposing an area of the substrate. Electrical connections between cells are made by corner conductors formed on or in the substrate in these corner regions. Consequently, this approach presents a solar cell array design based on individual cells.

Thus, a single laydown process and layout can be used in the fabrication of solar cell arrays. Current flow between solar cells will be assisted with conductors embedded in the substrate. These electrical connections define the specific characteristics of the solar cell array, such as its dimensions, stayout zones, and circuit terminations. This approach simplifies manufacturing, enables automation, and bottoms costs and delivery times.

Figure 1:
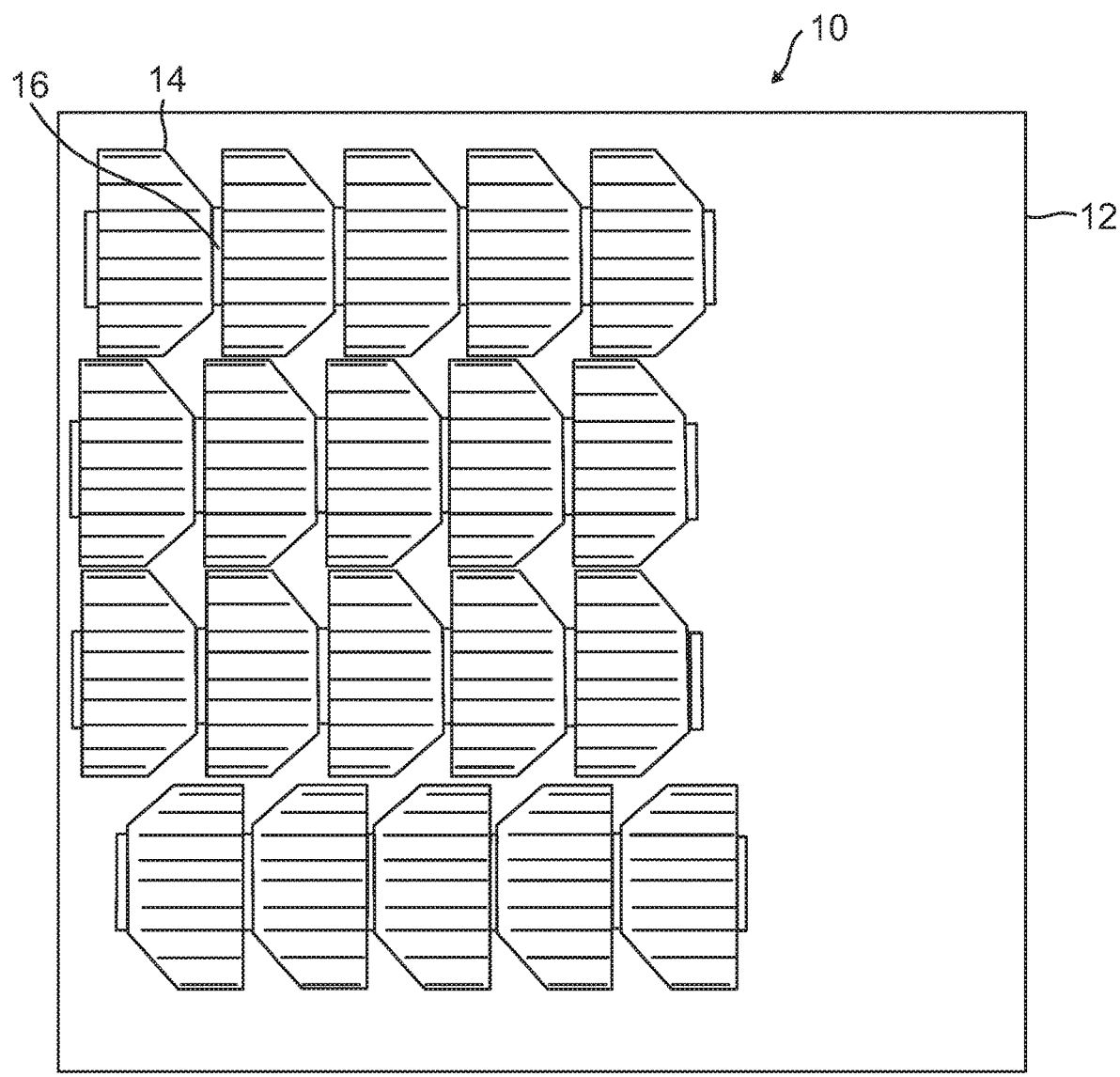
FIGS. 1 and 2 illustrate conventional structures for solar cell panels.
Figure 2:
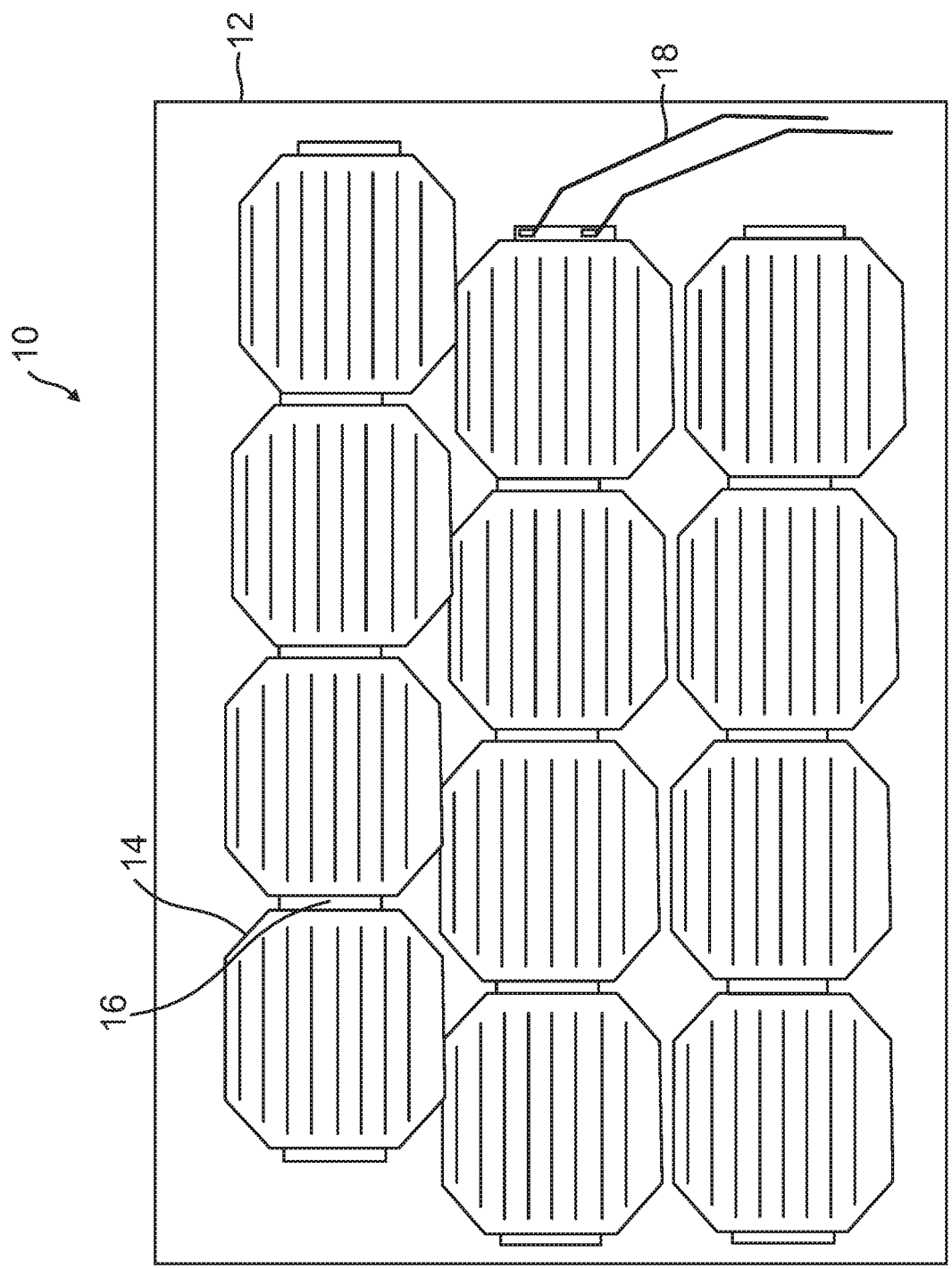

FIGS. 1 and 2 illustrate conventional structures for solar cell panels 10, which include a substrate 12, a plurality of solar cells 14 arranged in an array, and electrical connectors 16 between the solar cells 14. Half size solar cells 14 are shown in FIG. 1 and full size solar cells 14 are shown in FIG. 2. Space solar cells 14 are derived from a round Germanium (Ge) substrate starting material, which is later fabricated into semi-rectangular shapes to improve dense packing onto the solar cell panel 10. This wafer is often diced into one or two solar cells 14 herein described as half size or full size solar cells 14. The electrical connectors 16 providing electrical connections between solar cells 14 are made along the long parallel edge between solar cells 14. These series connections (cell-to-cell) are completed off-substrate, as strings of connected solar cells 14 are built having lengths of any number of solar cells 14. The completed strings of solar cells 14 are then applied and attached to the substrate 12.

In FIG. 2, wiring 18 is attached at the end of a string of solar cells 14 to electrically connect the string to other strings, or to terminate the resulting circuit and bring the current off of the array of solar cells 14. String-to-string and circuit termination connections are typically done on the substrate 12, and typically using wiring 18. However, some small solar cell panels 10 use a printed circuit board (PCB)-type material with embedded conductors.

Adjacent strings of connected solar cells 14 can run parallel or anti-parallel. In addition, strings of connected solar cells 14 can be aligned or misaligned. There are many competing influences to the solar cell 14 layout resulting in regions where solar cells 14 are parallel or anti-parallel, aligned or misaligned.

FIGS. 3A-3B illustrate an improved structure for a solar cell panel 10a, according to one example, wherein FIG. 3B is an enlarged view of the details in the dashed circle in FIG. 3A. The various components of the solar cell panel 10a are shown and described in greater detail in FIGS. 5-13.

The solar cell panel 10a includes a substrate 12 for solar cells 14 having one or more corner conductors 20 thereon. In one example, the substrate 12 is a multi-layer substrate 12 comprised of one or more Kapton® (polyimide) layers separating one or more patterned metal layers. The substrate 12 may be mounted on a large rigid panel 10a similar to conventional assembles. Alternatively, substrate 12 can be mounted to a lighter more sparse frame or panel 10a for mounting or deployment.

A plurality of solar cells 14 are attached to the substrate 12 in a two-dimensional (2D) grid of an array 22. In this example, the array 22 is comprised of ninety-six (96) solar cells 14 arranged in four (4) rows by twenty-four (24) columns, but it is recognized that any number of solar cells 14 may be used in different implementations.

At least one of the solar cells 14 has at least one cropped corner 24 that defines a corner region 26, as indicated by the dashed circle. The solar cells 14 are attached to the substrate 12, such that corner regions 26 of adjacent ones of the solar cells 14 are aligned, thereby exposing an area 28 of the substrate 12. The area 28 of the substrate 12 that is exposed includes one or more of the corner conductors 20, and one or more electrical connections between the solar cells 14 and the corner conductors 20 are made in the corner regions 26 resulting from the cropped corners 24 of the solar cells 14.

In this example, the corner conductors 20 are conductive paths attached to, printed on, buried in, or deposited on the substrate 12, before and/or after the solar cells 14 are attached to the substrate 12, which facilitate connections between adjacent solar cells 14. The connections between the solar cells 14 and the corner conductors 20 are made after the solar cells 14 have been attached to the substrate 12.

In one example, four adjacent solar cells 14 are aligned on the substrate 12, such that four cropped corners 24, one from each solar cell 14, are brought together at the corner regions 26. The solar cells 14 are then individually attached to the substrate 12, wherein the solar cells 14 are placed on top of the corner conductors 20 to make the electrical connection between the solar cells 14 and the corner conductors 20.

The solar cells 14 may be applied to the substrate 12 as CIC (cell, interconnect and coverglass) units. Alternatively, a bare solar cell 14 may be applied to the substrate 12, and the coverglass later applied to the front of the solar cell 14 with a transparent adhesive. This assembly protects the solar cells 14 from damage from space radiation that would limit performance.

FIGS. 4A and 4B illustrate an alternative structure for the solar cell panel 10a, according to one example, wherein FIG. 4B is an enlarged view of the details in the dashed circle in FIG. 4A. In this example, only a few corner conductors 20 are printed on or integrated with the substrate 12. Instead, most of the corner conductors 20 are contained within a power routing module (PRM) 30 that is attached to the substrate 12.

Figure 5:
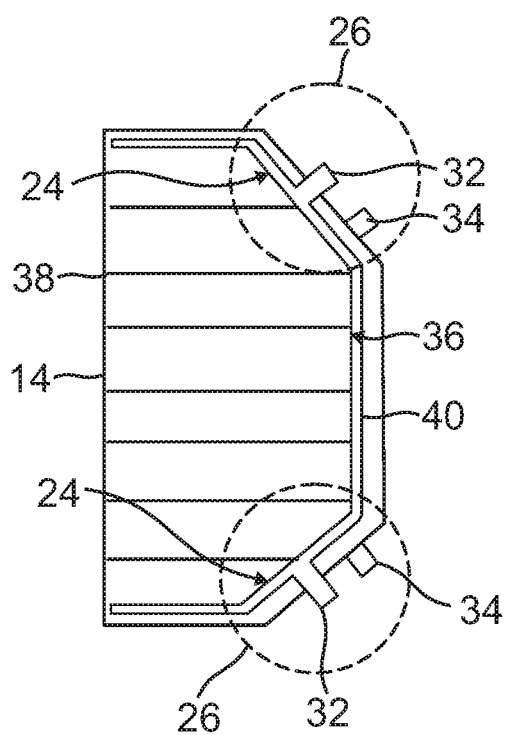
FIG. 5 illustrates the front side of an exemplary solar cell that may be used in the improved solar cell panel of FIGS. 3A-3B and 4A-4B.

FIG. 5 illustrates the front side of an exemplary solar cell 14 that may be used in the improved solar cell panel 10a of FIGS. 3A-3B and 4A-4B. The solar cell 14, which is a CIC unit, is a half-size solar cell 14. (Full-size solar cells 14 could also be used.)

The solar cell 14 is fabricated having at least one cropped corner 24 that defines a corner region 26, as indicated by the dashed circle, such that the corner region 26 resulting from the cropped corner 24 includes at least one contact 32, 34 for making an electrical connection to the solar cell 14. In the example of FIG. 5, the solar cell 14 has two cropped corners 24, each of which has both a front contact 32 on the front side of the solar cell 14 and a back contact 34 on a back side of the solar cell 14, where the contacts 32 and 34 extend into the corner region 26. (Full-size solar cells 14 would have four cropped corners 24, each of which would have a front contact 32 and a back contact 34.)

The cropped corners 24 increase utilization of the round wafer starting materials for the solar cells 14. In conventional panels 10, these cropped corners 24 would result in unused space on the panel 10 after the solar cells 14 are attached to the substrate 12. The new approach described in this disclosure, however, utilizes this unused space. Specifically, metal foil interconnects, comprising the corner conductors 20, front contacts 32 and back contacts 34, are moved to the corner regions 26. In contrast, existing CICs have interconnects attached to the solar cell 14 front side, and connect to the back side (where connections occur) during stringing.

The current generated by the solar cell 14 is collected on the front side of the solar cell 14 by a grid 36 of thin metal fingers 38 and wider metal bus bars 40 that are connected to both of the front contacts 32. There is a balance between the addition of metal in grid 36, which reduces the light entering the solar cell 14 and its output power, and the reduced resistance of having more metal. The bus bar 40 is a low resistance conductor that carries high currents and also provides redundancy should a front contact 32 become disconnected. Optimization generally desires a short bus bar 40 running directly between the front contacts 32. Having the front contact 32 in the cropped corner 24 results in moving the bus bar 40 away from the perimeter of the solar cell 14. This is achieved while simultaneously minimizing the bus bar 40 length and light obscuration. Additionally, the fingers 38 are now shorter. This reduces parasitic resistances in the grid 36, because the length of the fingers 38 is shorter and the total current carried is less. This produces a design preference where the front contacts 32 and connecting bus bar 40 is moved to provide shorter narrow fingers 38.

Figure 6:
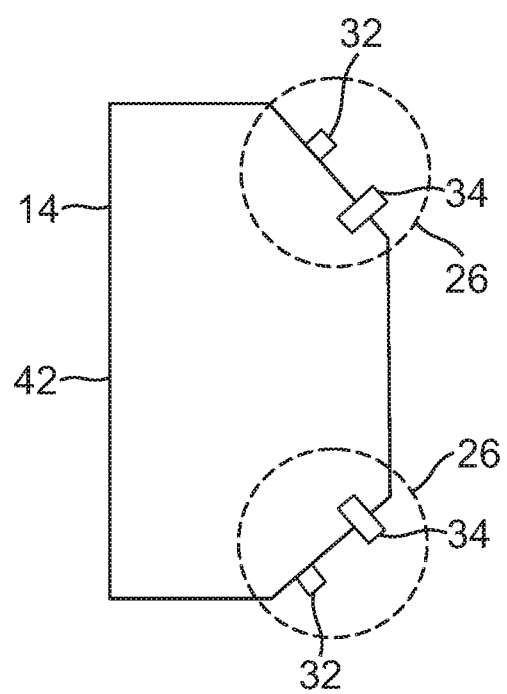
FIG. 6 illustrates the back side of the exemplary solar cell of FIG. 5.

FIG. 6 illustrates the back side of the exemplary solar cell 14 of FIG. 5. The back side of the solar cell 14 is covered by a full area metal back layer 42 that is connected to both of the back contacts 34.

Figure 7:
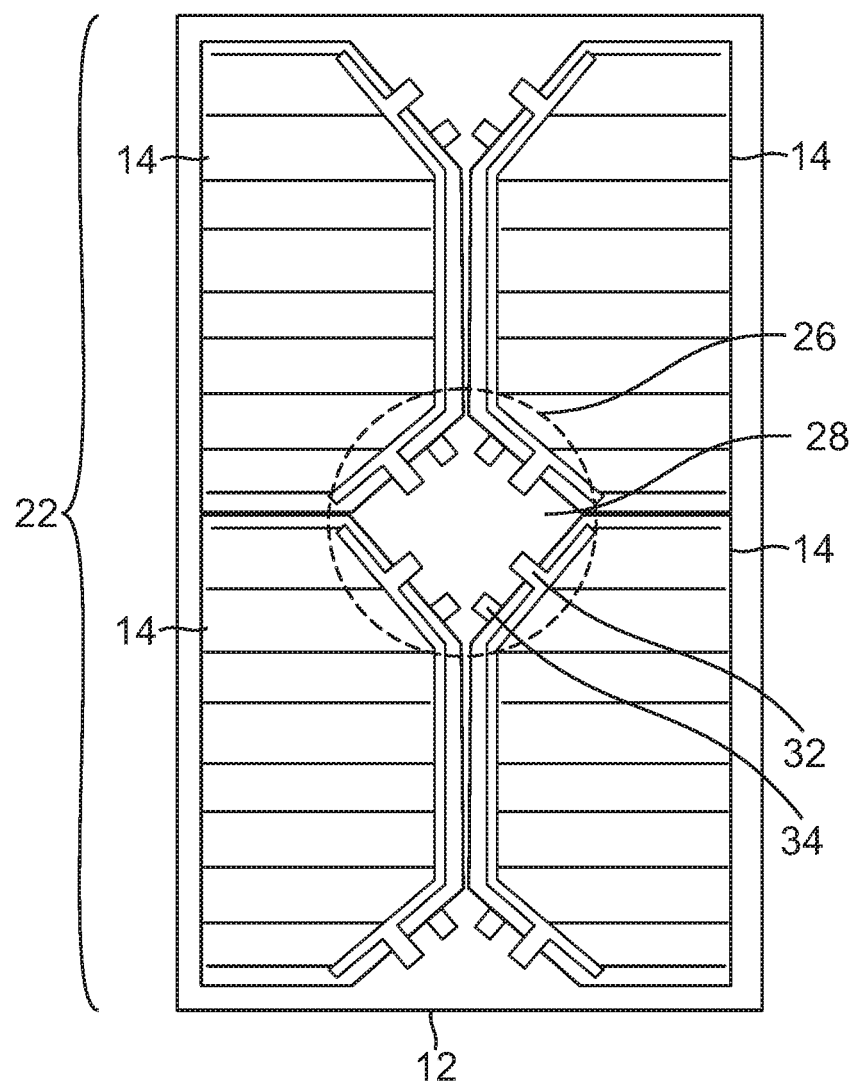
FIG. 7 illustrates cells arranged into a two-dimensional (2D) grid of an array, according to one example.

FIG. 7 illustrates solar cells 14 arranged into the 2D grid of the array 22, according to one example. The array 22 comprises a plurality of solar cells 14 attached to a substrate 12, such that corner regions 26 of adjacent ones of the solar cells 14 are aligned, thereby exposing an area 28 of the substrate 12. Electrical connections (not shown) between the solar cells 14 are made in the exposed area 28 of the substrate 12 using the front contacts 32 and back contacts 34 of the solar cells 14 and corner conductors 20 (not shown) formed on or in the exposed area 28 of the substrate 12.

During assembly, the solar cells 14 are individually attached to the substrate 12. This assembly can be done directly on a support surface, i.e., the substrate 12, which can be either rigid or flexible. Alternatively, the solar cells 14 could be assembled into the 2D grid of the array 22 on a temporary support surface and then transferred to a final support surface, i.e., the substrate 12.

Figure 8:
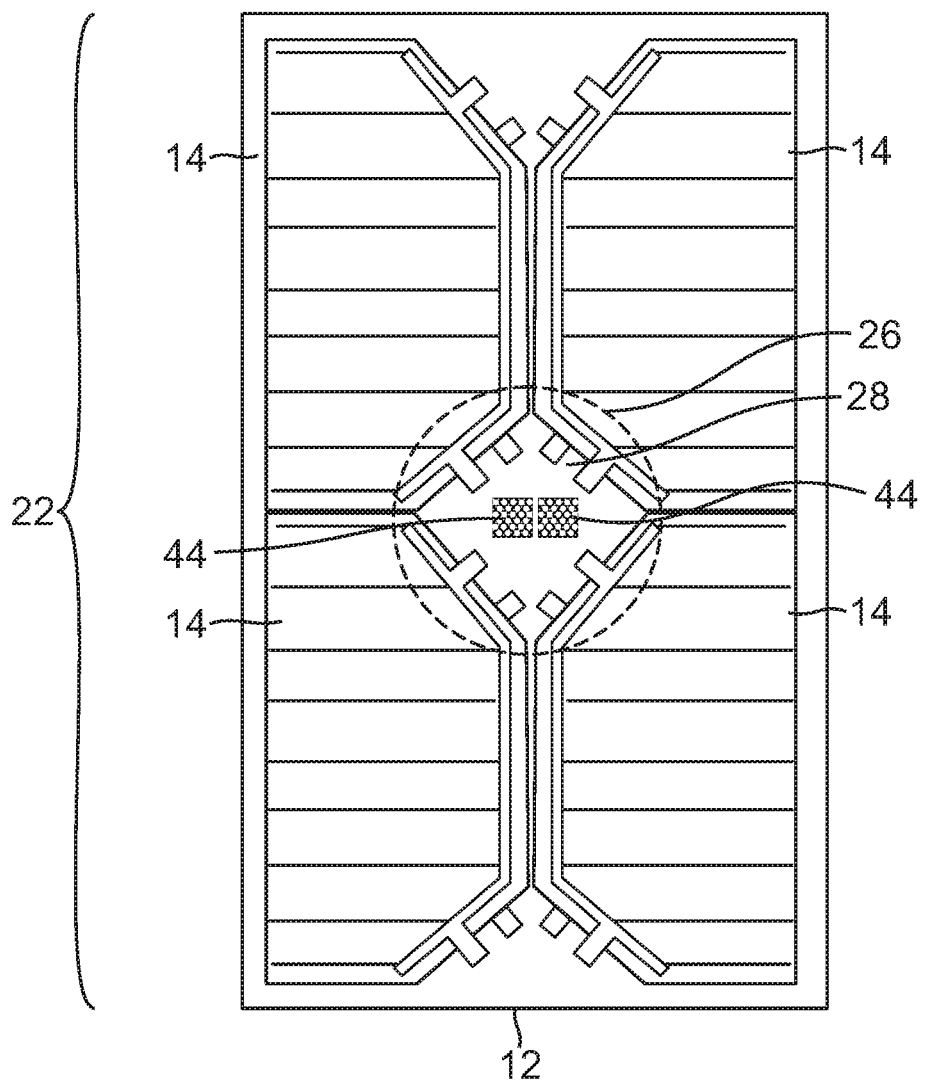
FIG. 8 illustrates an example of the array where one or more bypass diodes are added to the exposed area of the substrate in the corner regions.

FIG. 8 illustrates an example of the array 22 where one or more bypass diodes 44 are added to the exposed area 28 of the substrate 12 in the corner regions 26, for use in one or more of the electrical connections. The bypass diodes 44 protect the solar cells 14 when the solar cells 14 become unable to generate current, which could be due to being partially shadowed, which drives the solar cells 14 into reverse bias. In one example, the bypass diodes 44 are attached to the substrate 12 in the corner regions 26 independent of the solar cells 14.

Figure 9:
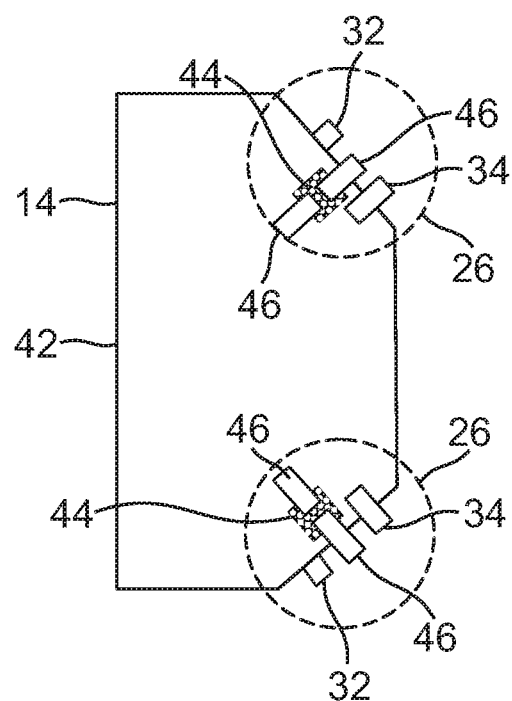
FIG. 9 illustrates an example where the bypass diode is applied to the back side of the cell, with an interconnect or contact for the bypass diode extending into the corner region between front and back contacts.

FIG. 9 illustrates an example where the bypass diode 44 is applied to the back side of the solar cell 14, with an interconnect or contact 46 for the bypass diode 44 extending into the corner region 26 between the front and back contacts 32, 34.

Figure 10:
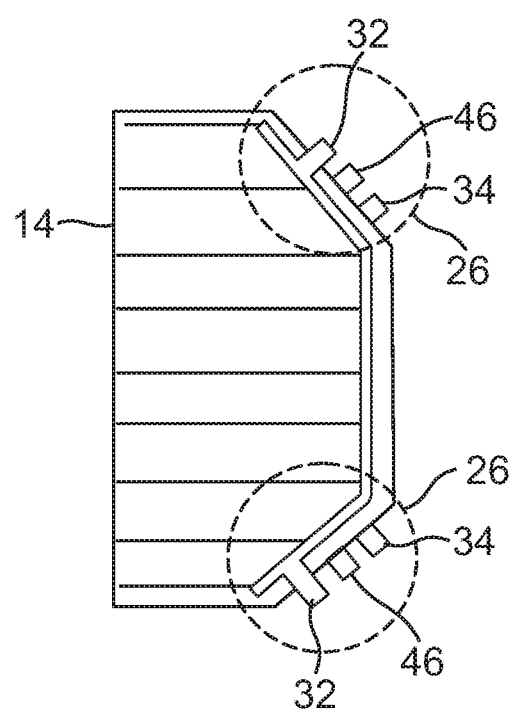
FIG. 10 illustrates a front side view of the example of FIG. 9, with the interconnect or contact for the bypass diode extending into the corner region between the front and back contacts.

FIG. 10 illustrates a front side view of the example of FIG. 9, with the interconnect or contact 46 for the bypass diode 44 (not shown) extending into the corner region 26 between the front and back contacts 32, 34.

Figure 11:
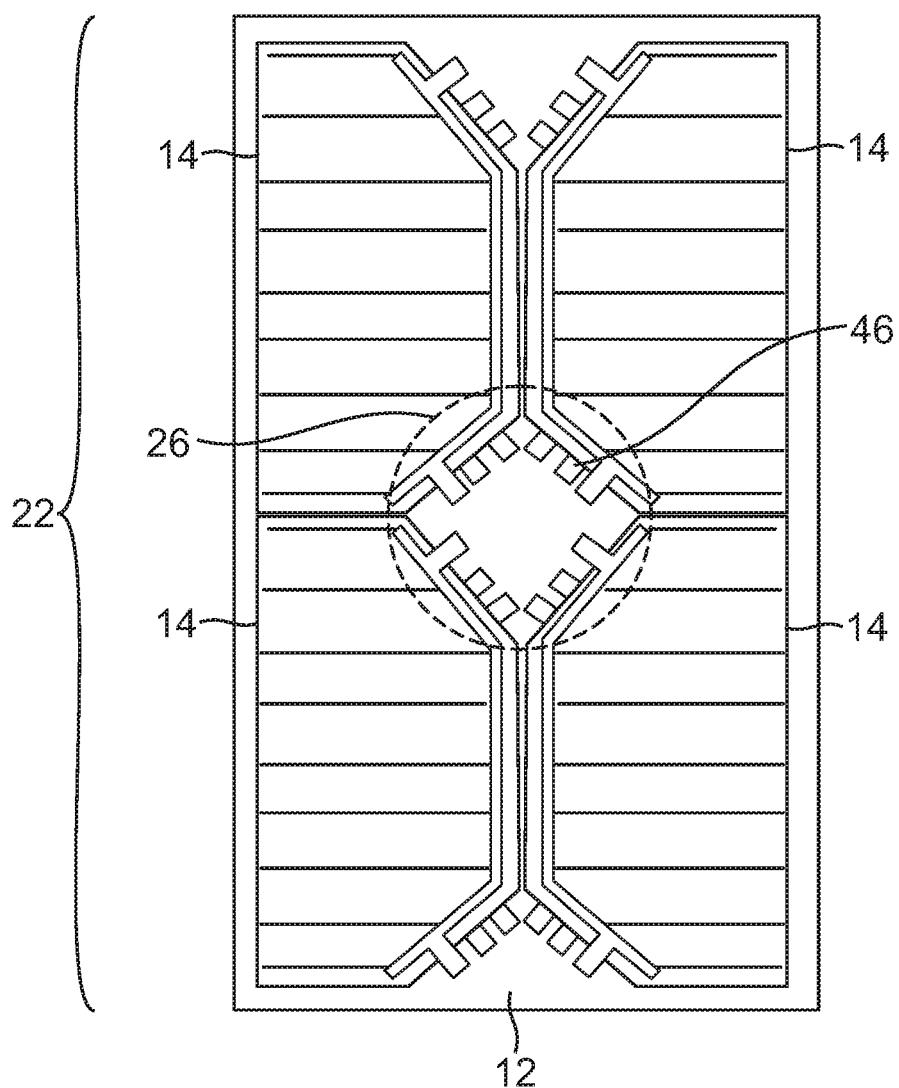
FIG. 11 illustrates the cells of FIGS. 9 and 10 arranged into the 2D grid of the array and applied to the substrate, where the bypass diodes are applied to the back side of the cells, with the contacts for the bypass diodes extending into the corner regions of the cells.

FIG. 11 illustrates the solar cells 14 of FIGS. 9 and 10 arranged into the 2D grid of the array 22 and applied to the substrate 12, where the bypass diodes 44 (not shown) are applied to the back side of the solar cells 14, with the contacts 46 for the bypass diodes 44 extending into the corner regions 26 of the solar cells 14.

One advantage of this approach is that the layouts illustrated in FIGS. 7, 8 and 11 are generalized layouts. Specifically, these layouts can be repeated across any panel 10a dimensions desired by a customer. This greatly simplifies assembly, rework, test, and inspection processes.

Following solar cell 14 and bypass diode 44 placement, there is another step where customization is accomplished. The front contacts 32 and back contacts 34 in the corner regions 26 of the solar cells 14 must be connected. This can be done in many combinations in order to route current through a desired path.

After attaching solar cells 14 to the substrate 12, connections are made between the solar cells 14 and the corner conductors 20. Front and back contacts 32, 34 of the solar cells 14 are present in each corner region 26 for attachment to the corner conductors 20. Interconnects for the front and back contacts 32, 34 of each of the solar cells 14 are welded, soldered, or otherwise bonded onto the corner conductors 20 to provide a conductive path 20, 32, 34 for routing power out of the solar cells 14.

Using the corner conductors 20, any customization can be made in the electrical connections. Adjacent solar cells 14 can be electrically connected to flow current in up/down or left/right directions as desired by the specific design. Current flow can also be routed around stayout zones as needed. The length or width of the solar cell array 22 can be set as desired. Also, the width can vary over the length of the array 22.

Figure 12:
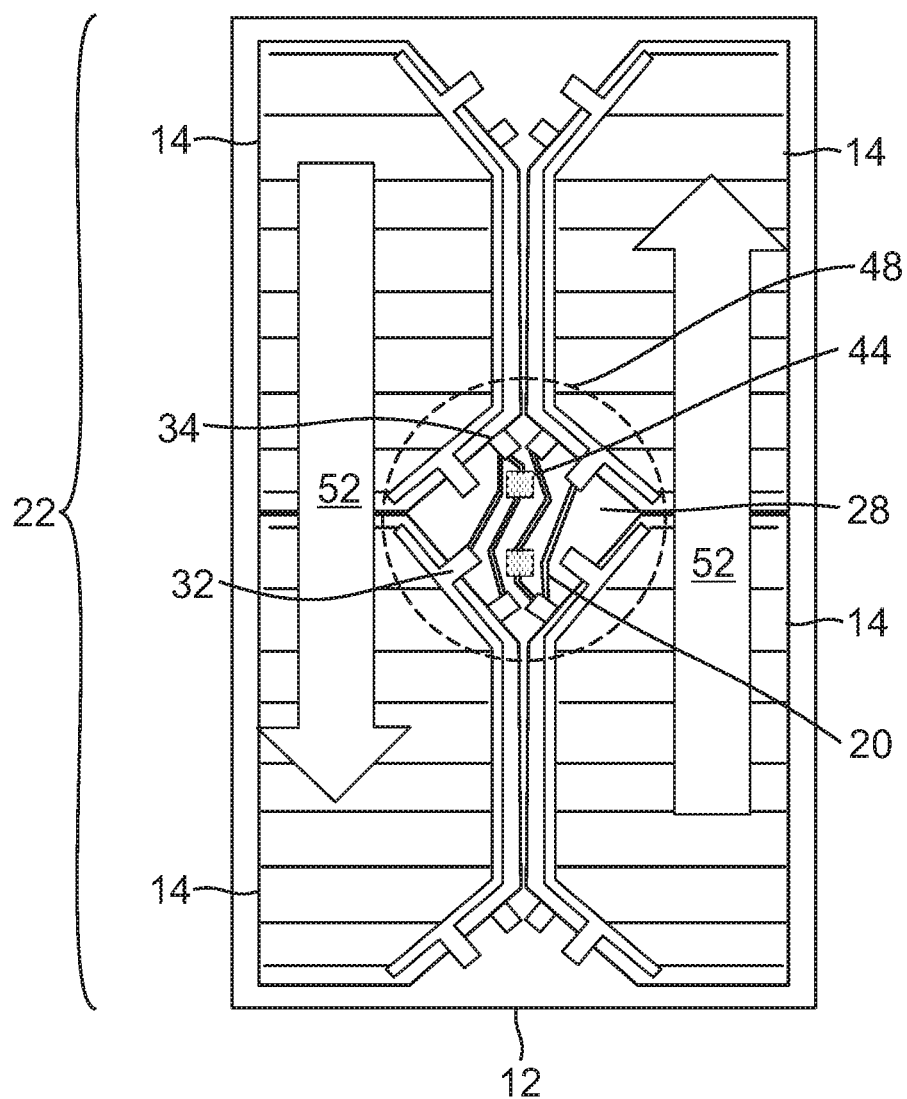
FIG. 12 shows up/down series connections between the cells of the array, according to one example.
Figure 13:
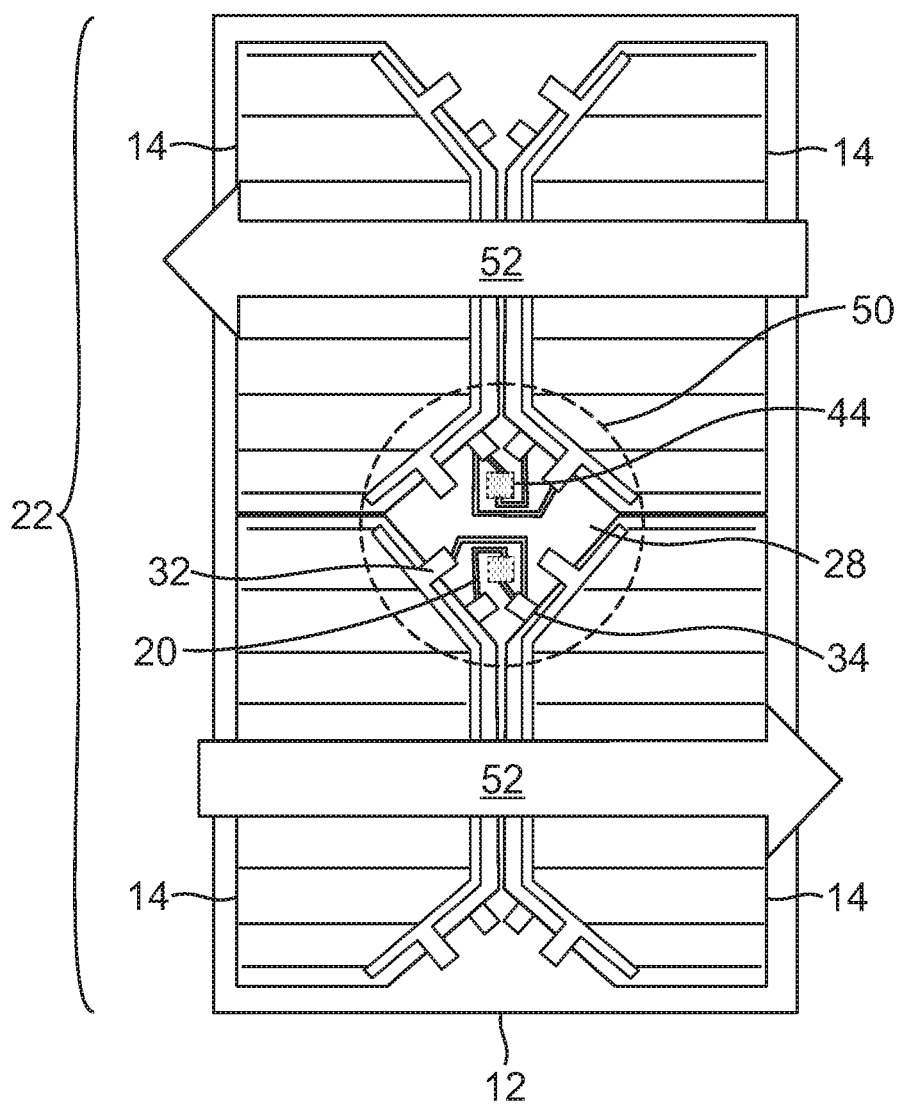
FIG. 13 shows left/right series connections between the cells of the array, according to one example.

In one example, the electrical connections are series connections that determine a flow of current through the plurality of solar cells 14. This may be accomplished by the connection schemes shown in FIGS. 12 and 13, wherein FIG. 12 shows up/down series connections 48 between the solar cells 14 of the array 22, and FIG. 13 shows left/right series connections 50 between the solar cells 14 of the array 22. In both FIGS. 12 and 13, these series connections 48, 50 are electrical connections between the front contacts 32 and back contacts 34 of the solar cells 14, and the bypass diodes 44, are made using the corner conductors 20 formed on or in the exposed areas 28 of the substrate 12. These series connections 48, 50 determine the current (power) flow, as indicated by the arrows 52, through the solar cells 14, in contrast to the assembly of large strings off-substrate.

The corner conductors 20 between solar cells 14 can be in many forms. They could be accomplished using wires that have electrical connections made on both ends, which could be from soldering, welding, conducting adhesive, or other process. In addition to wires, metal foil connectors, similar to the interconnects, could be applied. Metal conductive paths or traces (not shown) can also be integrated with the substrate 12.

In summary, this new approach attaches the solar cells 14 individually to a substrate 12 such that the corner regions 26 of two, three or four adjacent solar cells 14 are aligned on the substrate 12. The solar cells 14 can be laid out so that the cropped corners 24 are aligned and the corner regions 26 are adjacent, thereby exposing an area 28 of the substrate 12. Electrical connections between solar cells 14 are made in these corner regions 26 between front contacts 32 and back contacts 34 on the solar cells 14, bypass diodes 44, and corner conductors 20 on or in the exposed area 28 of the substrate 12, wherein these conductive paths are used to create a string of solar cells 14 in a series connection 48, 50 comprising a circuit.

Nano-Metal Connections

Electrical connections for space-based solar cell arrays 22 are of critical importance. They must be both manufacturable, as well as reliable to survive a challenging environment, largely due to extensive thermal cycling on orbit.

Electrical connections using solder are highly manufacturable; however, they are only sufficient for more mild space missions. Solder connections are highly manufacturable with low pressure and temperature, but solder is composed of small grains of alloys with different metal compositions and these alloys have low melting temperatures of <300° C. Consequently, solder alloy phases and grains degrade through thermal cycles.

Welding, on the other hand, has become the industry standard for durability under these conditions. Welded connections can form solid, single phase metal connections using Ag/Ag joints that have superior performance through thermal cycles. However, the welding process requires stringent mechanical alignment of parts and high pressures of the welding tips which can lead to breakage.

Thus, it would be desirable to have the durability of a resistive-welded connection, with the ease of manufacture of a soldered connection.

This disclosure identifies the value in using nano-metals to form the electrical connections on space-based solar arrays 22. These nano-metals have the manufacturability of the solder, yet form the single composition of a high melting point material that gives welded connections their durability.

FIGS. 14A-14F illustrate the advantages of a nano-metal contact formation.

Figure 14B:
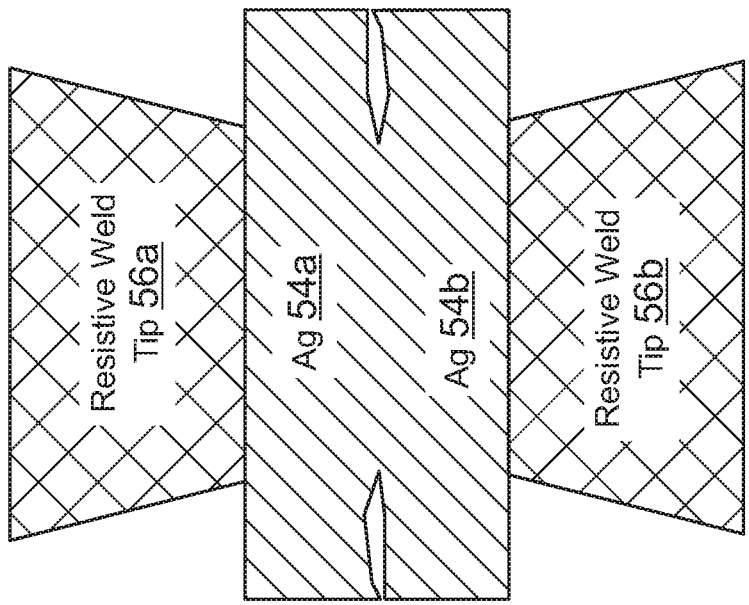
FIG. 14A shows a weld-based electrical connection before welding and FIG. 14B shows a weld-based electrical connection after welding.
Figure 14A:
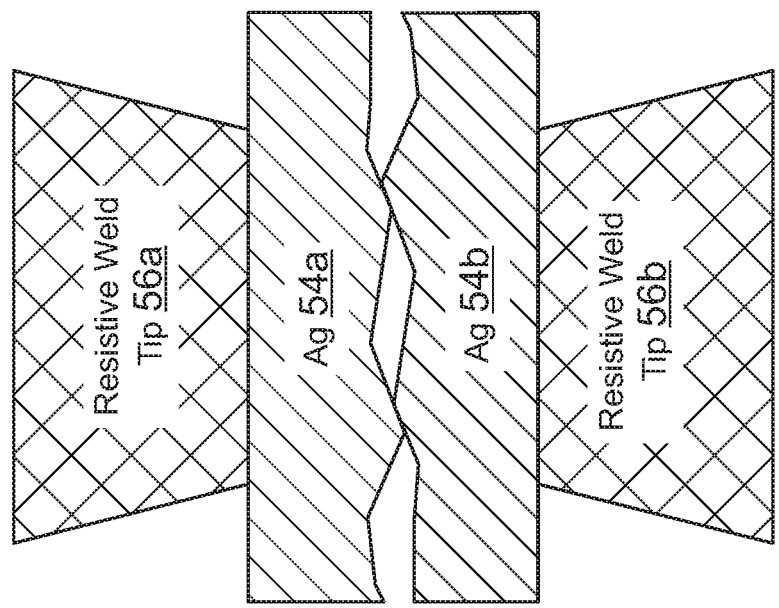

FIG. 14A shows a weld-based electrical connection before welding and FIG. 14B shows a weld-based electrical connection after welding, using two Ag metal pieces 54a, 54b. A roughness is drawn where the two Ag metal pieces 54a, 54b are brought into contact to emphasize the significance of mating the pieces on a microscopic level. The resistive weld tips 56a, 56b apply a large force on opposing sides bringing the pieces 54a, 54b together, wherein a pulse of current flows between the tips 56a, 56b. This current rapidly heats the metal of the pieces 54a, 54b and, with the applied force of the tips 56a, 56b, a solid Ag joint is formed by the pieces 54a, 54b that has excellent survival against thermal cycling.

Figure 14D:
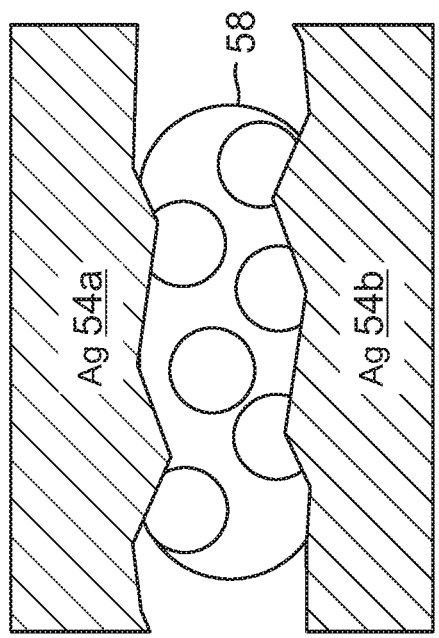
FIG. 14C shows a solder-based electrical connection before heating and FIG. 14D shows a solder-based electrical connection after heating.
Figure 14C:
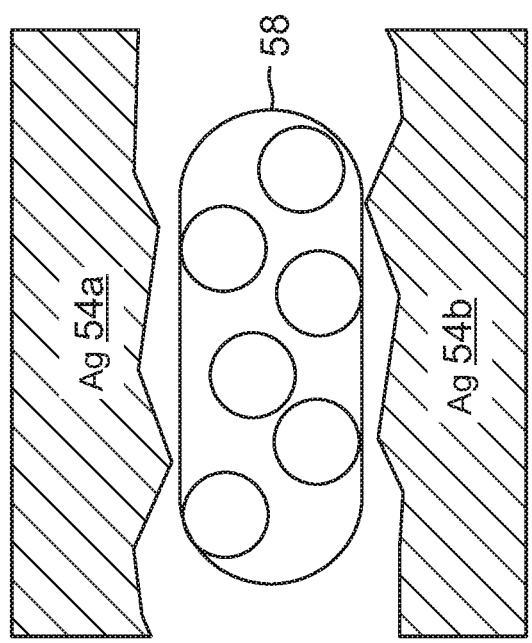

FIG. 14C shows a solder-based electrical connection before heating of the solder 58 and FIG. 14D shows a solder-based electrical connection after heating, using two Ag metal pieces 54a, 54b with a solder 58 positioned between the pieces 54a, 54b. Many solders can be considered, which generally involve alloys of Indium (In), Tin (Sn) and/or Lead (Pb), which provide for a low melting point of 150-250° C. Ag is often added to the solder 58, which controls reactions when soldering to Ag metal pieces 54a, 54b, as shown in this case. The solder 58 is based on mixture of at least two metals with a eutectic phase diagram. The eutectic is a metal composition that has a low melting point. The melted metal has a single composition. Upon cooling, it solidifies with a eutectic transformation into two compositions that are highly different. For example, a Sn/Pb solder 58 would solidify into a Sn-rich phase and a Pb-rich phase. (The circles in FIGS. 14C and 14D are meant to indicate the grains with different phases.) Overall, the composition is the same as the melt, but the composition is distributed differently in the solid. These phases have different melting points, creep rates, and different coefficients of thermal expansion. The phases thus respond differently to the thermal cycles, which leads to void formation between grains. These voids grow into cracks, which ultimately lead to failure. The low forces of the solder melt process and the low temperatures are desirable, but greater resistance to thermal cycling is needed as well.

Figure 14F:
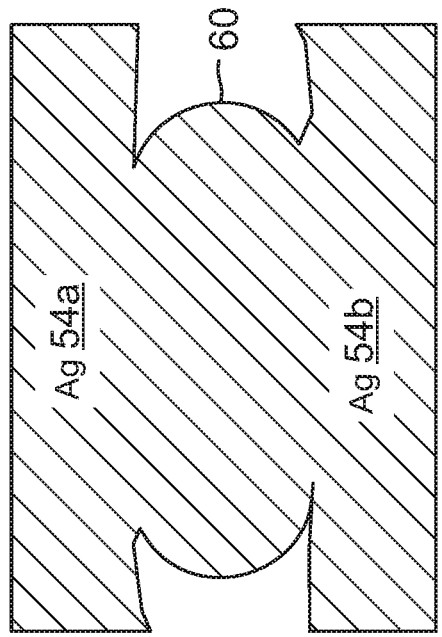
FIG. 14E shows a nano-metal based electrical connection before heating and FIG. 14F shows a nano-metal based electrical connection before after heating.
Figure 14E:
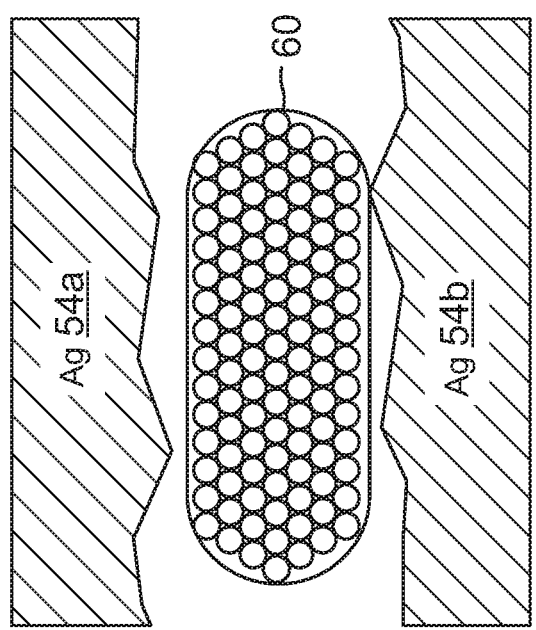

FIG. 14E shows a nano-metal based electrical connection before heating and FIG. 14F shows a nano-metal based electrical connection after heating, using two Ag metal pieces 54a, 54b with a nano-metal material 60 positioned between the pieces 54a, 54b. In one example, the nano-metal material 60 is a nano-Ag material, for example, a paste or ink with nano-Ag particles that have sizes less than about 100 nm and possibly sizes in the range of about 0.5-10 nm. The small nano-Ag particles have a very high surface area, meaning many of the Ag atoms are unbonded. This lack of bonding is an instability. The Ag in these particles are unstable. When brought into contact, the surface Ag atoms are unbonded and can move or rearrange. The result is high mobility of the Ag atoms at temperatures of 150-250° C., which is similar to melting. At these temperatures, the nano-Ag particles merge into a network. Lower temperatures<180° C. and lower applied pressures<1 MPa result in a porous network of solid, single phase Ag. Higher temperatures>200° C. and higher applied pressures>1 MPa result in a densification. This has been used for attaching integrated circuits to circuit boards and shown improved lifetime against thermal cycling as compared to solder. The nano-Ag material 60 is applied and processed similar to a solder 58. Thus, it provides the manufacturing advantages of a solder 58. After thermal processing, a solid Ag joint is formed between the Ag metal pieces 54a, 54b and the nano-Ag material 60 that is rugged against thermal cycles.

Figure 15:
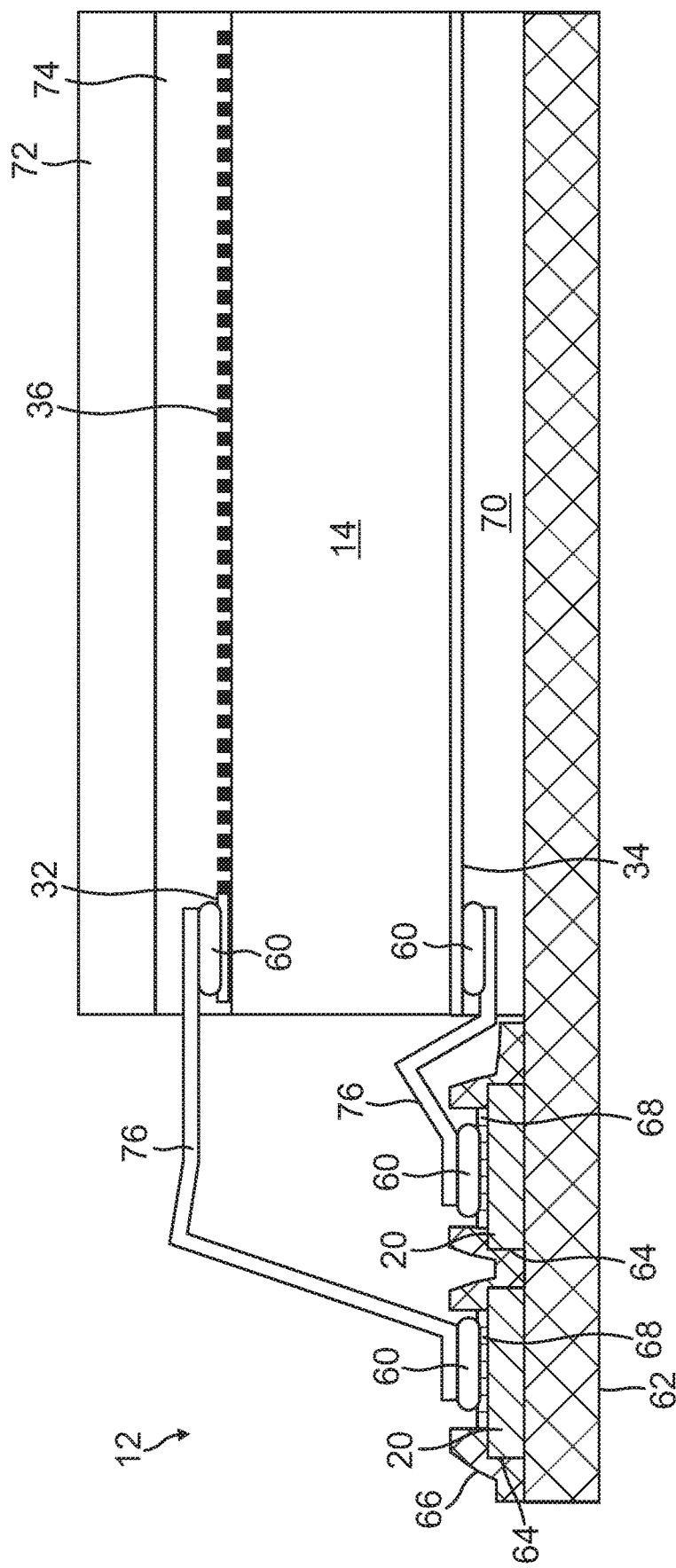
FIG. 15 shows a side view of a solar cell on a substrate that is a flex sheet assembly, which is part of a solar cell array on a solar cell panel, according to one example.

FIG. 15 shows a side view of a solar cell 14 on a substrate 12 that is a flex sheet assembly, which is part of a solar cell array 22 on a solar cell panel 10a, according to one example. The substrate 12 includes a polyimide base layer 62 with a Copper (Cu) layer 64 above it, wherein the Cu layer 64 is patterned into two corner conductors 20. A polyimide top overlay 66 is positioned against the front surface of Cu layer 64. The polyimide top overlay 66 has holes through to the two corner conductors 20 of the Cu layer 64, which are subsequently plated with an Ag or Au surface layer 68. Shown on the right side is a CIC unit comprising a solar cell 14 that is attached on its back side to the substrate 12 with adhesive 70, a grid 36 on a front side (top) of the solar cell 14, and a coverglass 72 attached to the grid 36 and front side of the solar cell 14 with adhesive 74. Also visible are the metal foil interconnects 76 attached to the nano-metal material 60 on top of the plated Ag or Au surface layers 68 on the corner conductors 20 of the Cu layer 64 of the substrate 12 and to the nano-metal material 60 on top of the contacts 32, 34 on both the front and back sides of the solar cell 14. The metal foil interconnects 76 may also connect to bypass diodes 44 (not shown).

Specifically, FIG. 15 also shows an electrical connection formed between first and second conductive elements by inserting a nano-metal material 60 between the first and second conductive elements; and then heating the nano-metal material 60 to a melting or solidification temperature forming a heated nano-metal material 60, to form the electrical connection between the first and second conductive elements. In this example, the first and second conductive elements comprise: (1) the metal foil interconnects 76 and the plated Ag or Au surface layers 68, as well as (2) the metal foil interconnects 76 and the front or back contacts 32, 34 on the solar cell 14. Moreover, the nano-metal material 60 can be applied to any or all of the electrical connections used with a solar cell 14 and a substrate 12 on which the solar cell 14 is attached.

Although the nano-metal material 60 is described above as a paste or ink comprised of one or more of Ag nano-particles, it is not limited to this material. In alternative examples, the nano-metal material 60 comprises a nano-metal paste or ink comprised of one or more of Au, Cu, Ag, and/or Al nano-particles that melt or fuse into a solid, similar to a solder 58, to form the electrical connection. Preferably, the nano-metal material 60 particles have low melting temps, e.g., about 150-250 degrees C., and more preferably, about 175-225 degrees C.

Nonetheless, Ag may be preferred for the nano-metal material 60, because Ag is often used for the metal foil interconnects 76 and grid 36, as it is highly conductive and can be formed well into desired shapes, although Ag does tarnish and can erode in space environments with high atomic oxygen. In some cases, Au can be preferred even with its higher cost or to use in an Au-coated Ag. Other alternatives include Cu or Al, which are substantially lower cost than Ag or Au. Any of these metals could be used for both the metal foil interconnects 76 and/or the nano-metal material 60.

In most cases, the nano-metal material 60 is not an alloy. Alloy materials have different melting temps, which can be a problem with extreme thermal cycling.

However, one case of mixed metals is a nano-metal material 60 comprised of a paste or ink with Au, Cu, Ag, and/or Al nano-particles that is placed between Ag pieces 54a, 54b. Thus, there will be an interface between these metals. This will be a single large interface that is millimeter in size between metals with high melting points (greater than about 400° C.). This is a very different configuration than a solder connection that has numerous metal interfaces between micron size grains that have melting points less than about 400° C. Thus, creep, flow and failure of this interface is much less likely than the solder interface.

Back Contacts

This disclosure also describes how a solar cell 14 with back contacts 34 can be integrated with printed corner conductors 20 on a substrate 12 to form a solar cell array 22 that has no exposed metal. Specifically, through-holes are formed in the solar cell 14, which are then plated or deposited with metal to create vias to connect front contacts 32 of the solar cell 14 to back contacts 34 of the solar cell 14 for connection to traces on the substrate 12, using laser welding, soldering, or applying nano-metal pastes or other conducting adhesives.

This allows electrical connections to be protected from, rather than exposed to, the space environment. For example, solar cell arrays 22 with exposed metal are susceptible to ESD damage. Previously, insulating polymer paints or coatings have been applied to exposed metal features to prevent ESD.

Figure 16:
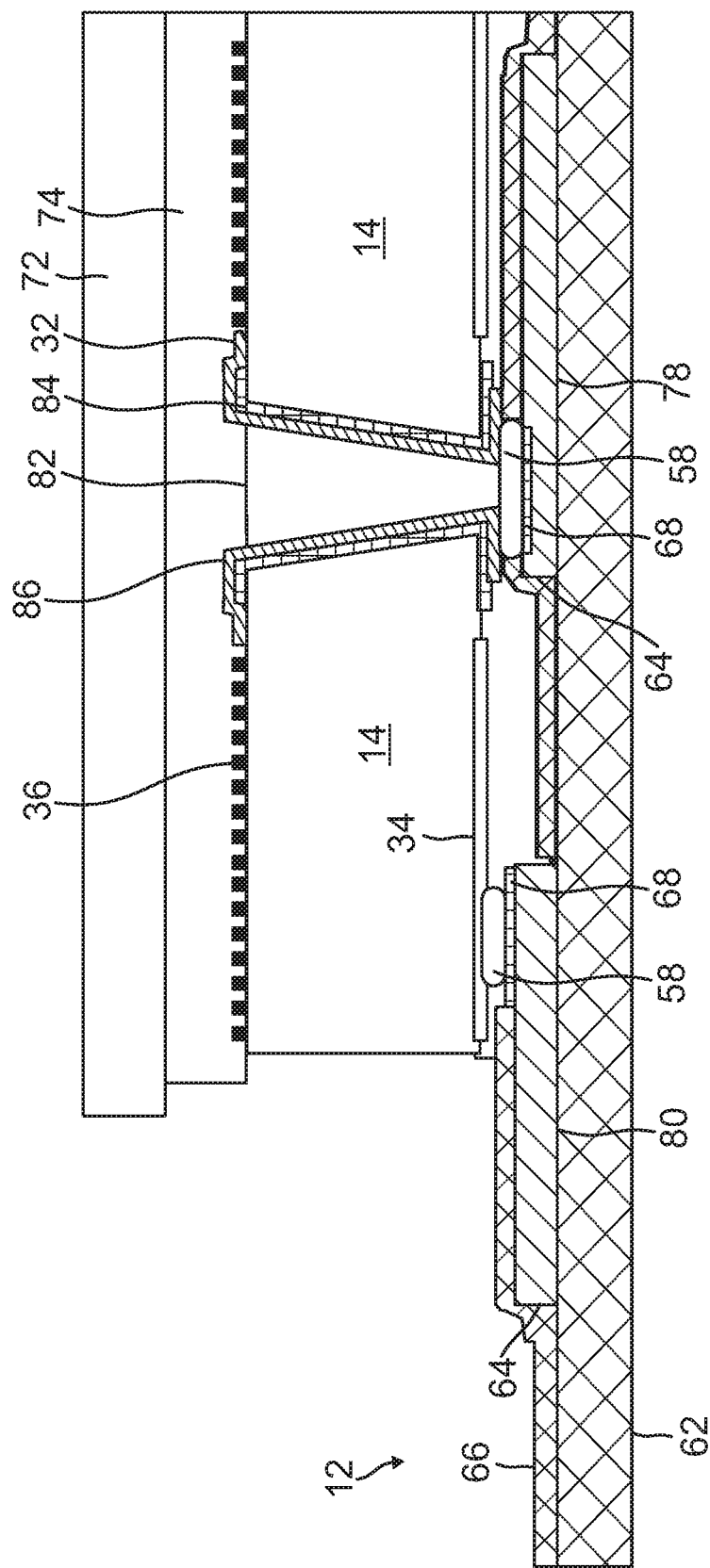
FIG. 16 illustrates a configuration where all of the electrical connections are made on the back side of the solar cell to buried connections in the substrate.

FIG. 16 also shows a side view of a solar cell 14 on a substrate 12 that is a flex sheet assembly, wherein the substrate 12 includes the polyimide base layer 62 with the Cu layer 64 above it. The polyimide top overlay 66 is positioned against the front surface of Cu layer 64, which is plated with the Ag or Au surface layer 68. Shown on the right side is the CIC unit comprising the solar cell 14 that is attached on its back side to the substrate 12, the grid 36 on a front side (top) of the solar cell 14, and the coverglass 72 attached to the grid 36 and front side of the solar cell 14 with adhesive 74.

In this configuration, all of the electrical connections are made on the back side of the solar cell 14 to buried traces 78, 80 patterned in the Cu layer 64 of the substrate 12. This is somewhat straightforward when making an electrical connection to the back contact 34 of the solar cell 14. However, this disclosure adds a plated through-hole or via 82 from the front side of the solar cell 14 to the back side of the solar cell 14, so that the front contact 32 of the solar cell 14 is electrically connected to the back side of the solar cell 14.

In one example, the through-hole 82 is created through the semiconductor layers of the solar cell 14 between a front side and a back side of the solar cell 14. Then, the sidewalls inside the through-hole 82 are passivated between the front and back sides of the solar cell 14, and an insulating layer 84 is applied inside the through-hole 82 that extends through the through-hole 82 and wraps on portions of both the front and back surfaces of the solar cell 14 adjacent the through-hole 82. A conductive layer 86 is deposited inside the through-hole 82, and on portions of both the front and back surfaces of the solar cell 14 adjacent the through-hole 82, resulting in the creation of a via 82. The conductive layer 86 is deposited on top of the insulating layer 84 on the sidewalls of the through-hole 82, and on portions of both the front and back surfaces of the solar cell 14 adjacent the through-hole 82, and the conductive layer 86 is deposited only on the sidewalls inside of the through-hole 82 without filling the through-hole 82. The via 82 provides a conductive path from the front contact 32 on the front side of the solar cell 14 to the back side of the solar cell 14.

An electrical connection is then made between the conductive layer 86 on the back side of the solar cell 14 and the trace 78 formed in the Cu layer 64 of the substrate 12, using solder 58 (or a nano-metal material 60) and the plated Ag or Au layer 68, resulting in an electrical connection to the front contact 32 on the front side of the solar cell 14. An electrical connection is also made between the back contact 34 of the solar cell 14 and the trace 80 formed in the Cu layer 64 of the substrate 12, also using solder 58 (or a nano-metal material 60) and the plated Ag or Au layer 68. Because the traces 78,80 are buried under the polyimide top overlay 66 in the substrate 12, this structure greatly minimizes any exposed metal in the solar cell array 22. Moreover, this is accomplished in a highly manufacturable way, which avoids the manual efforts currently used.

The via 82 also provides value to the performance of the solar cells 14. The front side of the solar cell 14 is a balance of requiring sufficient metal to have a low resistance to bring the current to the wires or interconnects carrying electrical current off of the solar cell 14. This is achieved by having long narrow lines in the grid 36. Larger solar cells 14 have longer lines and higher current levels requiring ever greater amounts of metal to achieve low resistances. The addition of this metal, however, results in greater obscuration of the surface of the solar cell 14, which reduces performance of the solar cell 14.

The via 82 of this disclosure completely changes this balance. Conventionally, the current from all the lines of the grid 36 was extracted to a wide bus bar on one side of the solar cell 14 and then to two or three interconnects. By using vias 82 at many points across the solar cell 14, the current on the front side of the solar cell 14 has a shorter path to travel, to more connection points, and less metal is needed.

Figure 17:
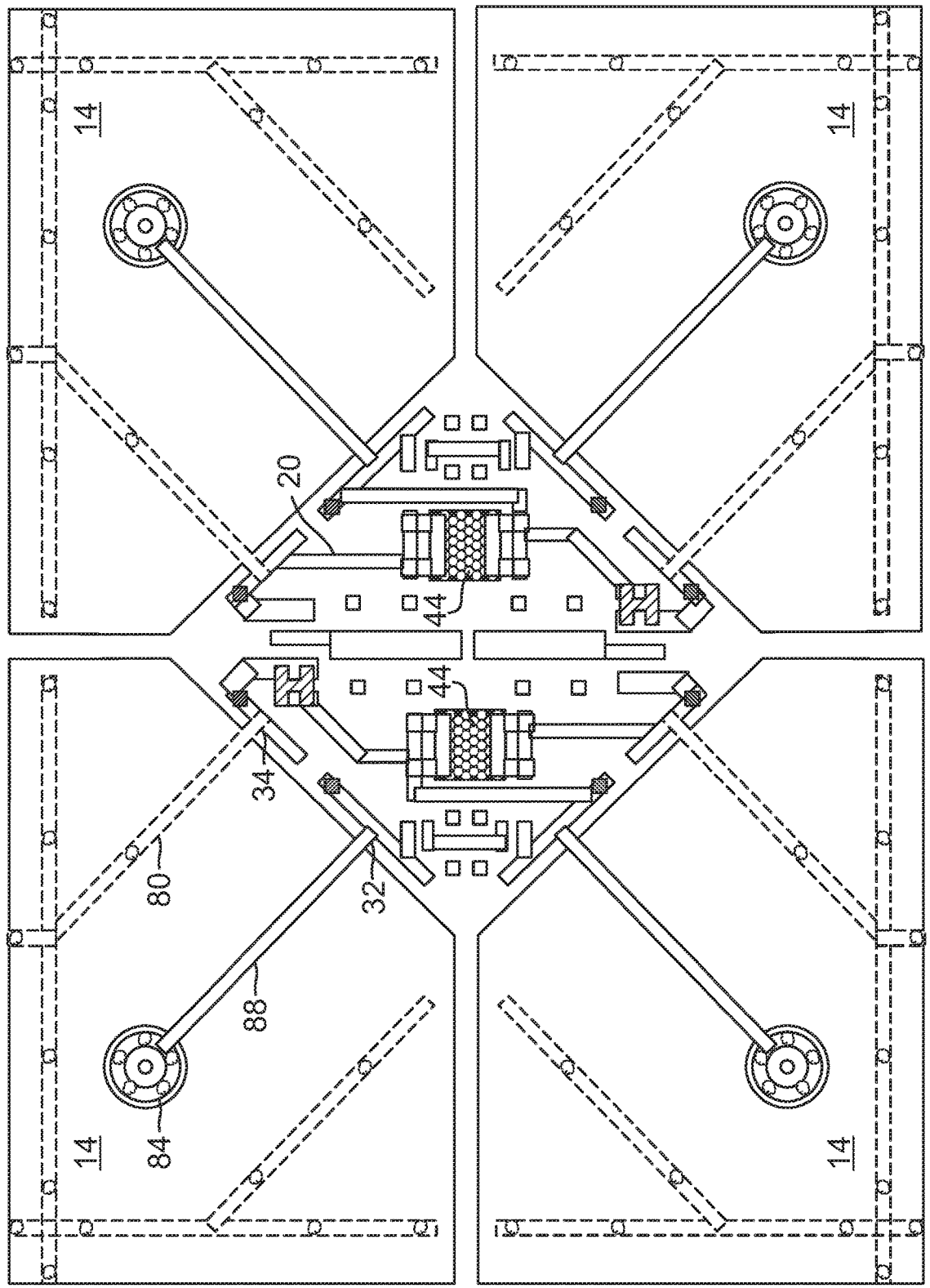
FIG. 17 shows how traces in the substrate under the solar cell could be laid out to extract current from the front and back contacts.

FIG. 17 shows how traces 78, 80 in the Cu layer 64 of the substrate 12 under the solar cell 14 could be laid out to extract current from the front and back contacts 32, 34. The electrical current collected by the grid 36 flows to the front contact 32 (as shown in FIG. 5). The current then flows from the front contact 32 along trace 88 to the via 82, and through the via 82 to the back side of the solar cell 14. The conductive layer 86 around the via 82 on the back side of the solar cell 14 contacts the trace 78 on the substrate 12 (as shown in FIG. 16). In addition, an electrical connection is made between the back contact 34 of the solar cell 14 and the trace 80. The traces 78, 80 are highly conductive paths buried in the substrate 12, and insulated from the solar cell 14, that do not block any sunlight. In this example, the dashed lines of the traces 80 indicate that they are hidden underneath the solar cells 14 (with traces 78 also hidden underneath the solar cells 14 and traces 88).

In addition, the fingers 38 of the grid 36 could be made shorter, for example, in a configuration with more vias 82. The conductive vias 82 also enable both the resistance and the obscuration to be reduced, which before were opposing goals.

The capability of a conductive via 82 is well known. What is significant about this disclosure, however, is how these vias 82 can be coupled with corner conductors 20 in the substrate 12 to extract power.

Moreover, a difficult part is making the electrical connection. Welding is preferred for its ruggedness in the thermal cycle environment of space and for many missions required. However, a resistive weld could be hard to accomplish in this design.

However, a laser weld is possible, but would require a transparent substrate 12, and is not possible with typical rigid substrates 12 that have opaque face sheets. On a flex sheet assembly, on the other hand, it is a possibility to consider.

A substrate 12 comprising a flex sheet assembly would most likely use polyimide, which strongly absorbs blue/UV light, giving it an orange appearance. It may be possible to use a red or near infrared laser for welding or to use a more transparent polymer. If possible to be formed, this could be a rugged connection suitable for the space environment.

Alternatively, soldering would be highly desirable and straightforward. Solder 58 preforms or paste could be added to one or both of the solar cell 14 and the substrate 12 electrical connections. These can be brought together, possibly with pressure, and heated to reflow the solder 58. This would be similar to circuit board assembly on a very large scale. Solder 58, however, is known to only be suitable for short space missions.

Another alternative would be to use a nano-metal material 60 for the electrical connections. The nano-metal material 60 may be comprised of a paste or ink with one or more of Au, Cu, Ag, and/or Al nano-particles that melt or fuse into a solid, similar to a solder 58, to form the electrical connection. Preferably, the nano-metal material 60 particles have low melting temps, e.g., about 150-250 degrees C., and more preferably, about 175-225 degrees C.

The use of nano-metal materials 60 could be very advantageous using a process similar to the process flow of solder 58, where the paste is dispensed, the pieces brought together, and heated. However, a solid single-phase metal connection using the nano-metal material 60 may have advantages to solder 58.

Fabrication

Examples of the disclosure may be described in the context of a method 90 of fabricating a solar cell 14, solar cell panel 10a and/or satellite, comprising steps 92-104, as shown in FIG. 18, wherein the resulting satellite 106 having a solar cell panel 10a comprised of solar cells 14 are shown in FIG. 19.

As illustrated in FIG. 18, during pre-production, exemplary method 90 may include specification and design 92 of the solar cell 14, solar cell panel 10a and/or satellite 106, and material procurement 94 for same. During production, component and subassembly manufacturing 96 and system integration 98 of the solar cell 14, solar cell panel 10a and/or satellite 106 takes place, which include fabricating the solar cell 14, solar cell panel 10a and/or satellite 106. Thereafter, the solar cell 14, solar cell panel 10a and/or satellite 106 may go through certification and delivery 100 in order to be placed in service 102. The solar cell 14, solar cell panel 10a and/or satellite 106 may also be scheduled for maintenance and service 104 (which includes modification, reconfiguration, refurbishment, and so on), before being launched.

Each of the processes of method 90 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 19, a satellite 106 fabricated by exemplary method 90 may include systems 108, a body 110, solar cell panels 10a comprised of solar cells 14, and one or more antennae 112. Examples of the systems 108 included with the satellite 106 include, but are not limited to, one or more of a propulsion system 114, an electrical system 116, a communications system 118, and a power system 120. Any number of other systems 108 also may be included.

FIG. 20 is an illustration of the solar cell panel 10a in the form of a functional block diagram, according to one example. The solar cell panel 10a is comprised of the solar cell array 22, which is comprised of one or more of the solar cells 14 individually attached to the substrate 12. Each of the solar cells 14 absorbs light 122 from a light source 124 and generates an electrical output 126 in response thereto.

At least one of the solar cells 14 has at least one cropped corner 24 that defines a corner region 26, such that an area 28 of the substrate 12 remains exposed when the solar cell 14 is attached to the substrate 12. When a plurality of solar cells 14 are attached to the substrate 12, the corner regions 26 of adjacent ones of the solar cells 14 are aligned, thereby exposing the area 28 of the substrate 12.

The area 28 of the substrate 12 that remains exposed includes one or more corner conductors 20 attached to, printed on, or integrated with the substrate 12, and one or more electrical connections between the solar cells 14 and the corner conductors 20 are made in a corner region 26. The corner region 26 may also include one or more bypass diodes 44.

The corner region 26 includes at least one contact, for example, a front contact 32 on a front side of the solar cell 14 and/or a back contact 34 on a back side of the solar cell 14.

The solar cell 14 may include a via 82 extending between a front side and a back side of the solar cell 14, wherein the via 82 provides a conductive path from the front contact 32 on the front side of the solar cell 14 to the back side of the solar cell 14. An electrical connection is then made between the via 82 on the back side of the solar cell 14 and the trace 78 formed in the substrate 12, using solder 58 or a nano-metal material 60, resulting in an electrical connection to the front contact 32 on the front side of the solar cell 14. An electrical connection is also made between the back contact 34 of the solar cell 14 and the trace 80 formed in the substrate 12, also using solder 58 or a nano-metal material 60. Because the traces 78, 80 are buried in the substrate 12, this structure greatly minimizes any exposed metal in the solar cell array 22.

The description of the examples set forth above has been presented for purposes of illustration and description, and is not intended to be exhaustive or limited to the examples described. Many alternatives, modifications and variations may be used in place of the specific elements described above.

What is claimed is:

1. A method, comprising:
fabricating a substrate with a corner region, the corner region including one or more corner conductors attached to or printed on the substrate;
installing a solar cell on the substrate, the solar cell having cropped corners, the solar cell having a front contact and a back contact extending into the corner region, a plurality of the solar cells and the substrate forming a solar cell array; and
forming an electrical connection between the solar cell and the substrate comprised of at least base and overlay layers separating and overlaying one or more patterned metal layers, the patterned metal layers forming one or more traces buried within the substrate that are electrically isolated from the solar cell, comprising:
creating a through-hole in the solar cell through both a front side and a back side of the solar cell;
depositing a conductive layer on portions of both the front side and the back side of the solar cell adjacent the through-hole and only on sidewalls inside of the through-hole without filling the through-hole, to create a via from the front side to the back side of the solar cell, thereby conducting current from the front contact of the solar cell through the via from the front side of the solar cell to the conductive layer on the back side of the solar cell; and
connecting the conductive layer on the back side of the solar cell to one of the traces buried in the substrate to form the electrical connection between the conductive layer on the back side of the solar cell and the one or more traces buried in the substrate; and
coupling the via with the one or more corner conductors to extract power from the solar cell.

2. The method of claim 1, further comprising passivating inside the through-hole in the solar cell between the front side and the back side of the solar cell before the conductive layer has been deposited.

3. The method of claim 2, further comprising depositing an insulating layer inside the through-hole after the through-hole has been passivated and before the conductive layer has been deposited.

4. The method of claim 3, wherein the insulating layer wraps on portions of front or back surfaces of the solar cell adjacent the through-hole.

5. The method of claim 1, wherein the via is connected to the front contact on the front side of the solar cell.

6. The method of claim 1, wherein the conductive layer on the back side of the solar cell is connected to the one or more traces buried in the substrate to form the electrical connection by applying a nano-metal material that is not an alloy between the conductive layer on the back side of the solar cell and the one or more traces buried in the substrate.

7. The method of claim 6, wherein the nano-metal material comprises a nano-metal paste or ink comprised of Gold (Au), Copper (Cu), Silver (Ag), or Aluminum (Al) nanoparticles.

8. The method of claim 7, wherein applying the nano-metal material comprises:
inserting the nano-metal material between the conductive layer on the back side of the solar cell and the one or more traces buried in the substrate; and
melting or fusing the nano-metal material.

9. The method of claim 8, wherein the nano-metal material melts or fuses into a solid, single-phase metal.

10. An article, comprising:
a substrate fabricated with a corner region, the corner region including one or more corner conductors attached to or printed on the substrate;
a solar cell installed on the substrate, the solar cell having cropped corners, the solar cell having a front contact and a back contact extending into the corner region, a plurality of the solar cells and the substrate forming a solar cell array;
an electrical connection between the solar cell and the substrate comprised of at least base and overlay layers separating and overlaying one or more patterned metal layers, the patterned metal layers forming one or more traces buried within the substrate that are electrically isolated from the solar cell, comprising:
a through-hole created in the solar cell through both a front side and a back side of the solar cell;
a conductive layer deposited on portions of both the front side and the back side of the solar cell adjacent the through-hole and only on sidewalls inside of the through-hole without filling the through-hole to create a via from the front side to the back side of the solar cell, thereby conducting current from the front contact of the solar cell through the via from the front side of the solar cell to the conductive layer on the back side of the solar cell; and
the conductive layer on the back side of the solar cell being connected to a trace buried in the substrate to form the electrical connection between the conductive layer on the back side of the solar cell and the one or more traces buried in the substrate; wherein
the via is coupled with the one or more corner conductors to extract power from the solar cell.

11. The article of claim 10, wherein inside the through-hole in the solar cell is passivated between the front side and the back side of the solar cell before the conductive layer has been deposited.

12. A solar cell panel, comprising:
a substrate fabricated with a corner region, the corner region including one or more corner conductors attached to or printed on the substrate;
a solar cell installed on the substrate, the solar cell having cropped corners, the solar cell having a front contact and a back contact extending into the corner region, a plurality of the solar cells and the substrate forming a solar cell array,
the solar cell array comprised of the solar cell and the substrate for the solar cell, wherein the substrate is comprised of at least base and overlay layers separating and overlaying one or more patterned metal layers, the patterned metal layers forming one or more traces buried within the substrate that are electrically isolated from the solar cell; and
an electrical connection between the solar cell and the substrate, comprising: a through-hole created in the solar cell through both a front side and a back side of the solar cell;
a conductive layer deposited on portions of both the front side and the back side of the solar cell adjacent the through-hole and only on sidewalls inside of the through-hole without filling the through-hole, to create a via from the front side to the back side of the solar cell, thereby conducting current from the front contact of the solar cell through the via from the front side of the solar cell to the conductive layer on the back side of the solar cell; and the conductive layer on the back side of the solar cell being connected to one of the traces buried in the substrate to form the electrical connection between the conductive layer on the back side of the solar cell and the one or more traces buried in the substrate, wherein the via is coupled with the one or more corner conductors to extract power from the solar cell.

13. The solar cell panel of claim 12, wherein inside the through-hole in the solar cell is passivated between the front side and the back side of the solar cell before the conductive layer has been deposited.

14. The solar cell panel of claim 13, wherein an insulating layer is deposited inside the through-hole after the through-hole has been passivated and before the conductive layer has been deposited.

15. The solar cell panel of claim 14, wherein the insulating layer wraps on portions of front or back surfaces of the solar cell adjacent the through-hole.

16. The solar cell panel of claim 12, wherein the via is connected to the front contact on the front side of the solar cell.

17. The solar cell panel of claim 12, wherein the conductive layer on the back side of the solar cell is connected to the one or more traces buried in the substrate to form the electrical connection by applying a nano-metal material that is not an alloy between the conductive layer on the back side of the solar cell and the one or more traces buried in the substrate.

18. The solar cell panel of claim 17, wherein the nano-metal material comprises a nano-metal paste or ink comprised of Gold (Au), Copper (Cu), Silver (Ag), or Aluminum (Al) nano-particles.

19. The solar cell panel of claim 18, wherein applying the nano-metal material comprises:

inserting the nano-metal material between the conductive layer on the back side of the solar cell and the one or more traces buried in the substrate; and melting or fusing the nano-metal material.

20. The solar cell panel of claim 19, wherein the nano-metal material melts or fuses into a solid, single-phase metal.

* * * * *